US012588330B2

(12) United States Patent (10) Patent No.: US 12,588,330 B2
Her et al. (45) Date of Patent: Mar. 24, 2026

(54) DISPLAY MODULE WITH ENCAPSULATED COLOR CONVERSION LAYER AND ELECTRONIC APPARATUS INCLUDING THE SAME

(71) Applicant: SAMSUNG ELECTRONICS CO., LTD., Suwon-si (KR)

(72) Inventors: Yongkoo Her, Suwon-si (KR); Kiwoo Kim, Suwon-si (KR); Hakyeol Kim, Suwon-si (KR); Seoungyong Park, Suwon-si (KR); Jaewook Park, Suwon-si (KR); Jungwoon Shin, Suwon-si (KR); Keunsik Lee, Suwon-si (KR); Hoyoung Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 709 days.

(21) Appl. No.: 17/840,056

(22) Filed: Jun. 14, 2022

(65) Prior Publication Data

US 2022/0367766 A1 Nov. 17, 2022

Related U.S. Application Data

(63) Continuation of application No. PCT/KR2022/005340, filed on Apr. 13, 2022.

(30) Foreign Application Priority Data

May 17, 2021 (KR) ........................ 10-2021-0063498

(51) Int. Cl.
*H10H 20/851* (2025.01)
*H01L 25/075* (2006.01)
(Continued)

(52) U.S. Cl.
CPC ..... *H10H 20/8514* (2025.01); *H01L 25/0753* (2013.01); *H10H 20/854* (2025.01); *H10H 20/856* (2025.01)

(58) Field of Classification Search
CPC ....... H01L 33/505; H01L 33/46; H01L 33/50; H01L 33/52; H01L 33/56; H01L 33/60;
(Continued)

(56) References Cited

U.S. PATENT DOCUMENTS 10,475,970 B2 11/2019 Chen et al.
10,686,019 B2 6/2020 Lee et al.
(Continued)

FOREIGN PATENT DOCUMENTS

KR 10-2018-0058565 A 6/2018
KR 10-2019-0052582 5/2019
(Continued)

OTHER PUBLICATIONS

Search Report and Written Opinion dated Aug. 1, 2022 issued in International Patent Application No. PCT/KR2022/005340.
(Continued)

*Primary Examiner* — Fernando L Toledo
*Assistant Examiner* — Ryan T. Fortin
(74) *Attorney, Agent, or Firm* — NIXON & VANDERHYE P.C.

(57) ABSTRACT

A display module comprises: a display panel comprising a substrate, a plurality of light sources including a plurality of light emitting devices mounted on the substrate, a color conversion layer and a color filter layer stacked on each of the plurality of light emitting devices, the plurality of light sources may each be provided with encapsulation structure, and a size of the color conversion layer may be less than a size of the light emitting device.

19 Claims, 39 Drawing Sheets

(51) Int. Cl.
    *H10H 20/854*     (2025.01)
    *H10H 20/856*     (2025.01)

(58) Field of Classification Search
    CPC ............. H01L 25/0753; H01L 27/1214; H01L
                 27/156; H01L 27/12; G09G 3/32
    See application file for complete search history.

(56) References Cited

U.S. PATENT DOCUMENTS

| | | | |
|---|---|---|---|
| 10,790,330 | B2 | 9/2020 | Lee et al. |
| 2016/0104869 | A1* | 4/2016 | Choi ..................... H10K 59/122 |
| | | | 257/40 |
| 2017/0117257 | A1 | 4/2017 | Lee et al. |
| 2018/0188579 | A1* | 7/2018 | Jeong .................. G02F 1/13336 |
| 2018/0287027 | A1* | 10/2018 | Chaji ................... H10H 20/812 |
| 2019/0189595 | A1 | 6/2019 | Lee et al. |
| 2019/0207063 | A1 | 7/2019 | Kim et al. |
| 2019/0378873 | A1 | 12/2019 | Lee et al. |
| 2020/0013761 | A1* | 1/2020 | Chaji ..................... H10H 29/41 |
| 2020/0152704 | A1 | 5/2020 | Jang et al. |
| 2020/0279979 | A1 | 9/2020 | Lee et al. |
| 2020/0343230 | A1 | 10/2020 | Sizov et al. |
| 2021/0005797 | A1* | 1/2021 | Kang ..................... H10H 20/84 |
| 2021/0013259 | A1 | 1/2021 | Ahn et al. |
| 2021/0118944 | A1 | 4/2021 | Han et al. |
| 2021/0135984 | A1 | 5/2021 | Jain et al. |
| 2021/0217739 | A1 | 7/2021 | Lee et al. |
| 2021/0288105 | A1* | 9/2021 | Kawanishi ........... H10H 20/857 |
| 2022/0085114 | A1 | 3/2022 | Seong et al. |

FOREIGN PATENT DOCUMENTS

| | | | | |
|---|---|---|---|---|
| KR | 10-2019-0058130 | 5/2019 | | |
| KR | 10-2020-0027136 | 3/2020 | | |
| KR | 10-2020-0049980 | 5/2020 | | |
| KR | 10-2020-0083879 | 7/2020 | | |
| KR | 10-2174847 | 11/2020 | | |
| KR | 10-2021-0006241 | 1/2021 | | |
| KR | 10-2021-0047590 | 4/2021 | | |
| WO | WO 2016/204166 | A1 * | 12/2016 | ............ H05B 33/12 |
| WO | WO 2020/258864 | A1 * | 12/2020 | .............. G09F 9/33 |

OTHER PUBLICATIONS

Extended European Search Report dated Jun. 24, 2024 issued in European Patent Application No. 22804843.5.

Korean Office Action dated Feb. 12, 2025 for KR Application No. 10-2021-0063498.

Rejection Decision dated Oct. 28, 2025 issued by the Korean Patent Office for Korean Patent Application No. 10-2021-0063498 which was filed on May 17, 2021 (with translation).

* cited by examiner

DISPLAY MODULE WITH ENCAPSULATED COLOR CONVERSION LAYER AND ELECTRONIC APPARATUS INCLUDING THE SAME

CROSS-REFERENCE TO RELATED APPLICATIONS

This application is a continuation of International Application No. PCT/KR2022/005340 designating the United States, filed on Apr. 13, 2022, in the Korean Intellectual Property Receiving Office and claiming priority to Korean Patent Application No. 10-2021-0063498, filed on May 17, 2021, in the Korean Intellectual Property Office, the disclosures of which are incorporated by reference herein in their entireties.

BACKGROUND

Field

This disclosure relates to a display module and an electronic apparatus including the display module, for example, to a display module including a color conversion material that is excited by light emitted from a light emitting device and emits light of a specified color and an electronic apparatus including the same.

Description of Related Art

An electronic apparatus (e.g. display device) including a display module may adopt a structure that lighting is available by joining on a substrate called a back plane in which the driving circuit is formed. In recent years, research has been conducted to improve color gamut and power consumption by applying a color conversion layer with a light emitting device that emits blue light with advantageous luminescence efficiency in the display device.

The color conversion layer may refer to a component of the pixel or subpixel of a display device, which emits light converted into one of red, green, or blue by incident light emitted from a light source of the display device. The display device may display a color image through pixels including a color conversion layer.

For a display device using an organic light emitting device, long-term use of the display device in a bright screen state may result in burn-in, which permanently changes the color of some areas of the screen, reducing the lifespan of the display panel.

A display device using micro-LEDs, an inorganic light-emitting device that can prevent and/or reduce burn-in compared to organic light emitting devices, is currently being developed. However, in the case of such display device, wavelength shift phenomenon may occur due to power consumption and current, and image quality deterioration may occur due to temperature changes in micro LEDs.

SUMMARY

Embodiments of the disclosure provide a display module for applying a color conversion layer based on an inorganic light-emitting device and forming an encapsulation structure for each subpixel and an electronic apparatus including the same.

A display module according to various example embodiments may include: a display panel comprising a plurality of light sources including a substrate, a plurality of light emitting devices mounted on the substrate, a color conversion layer and a color filter layer stacked on each of the plurality of light emitting devices, and the plurality of light sources may be provided with encapsulation structure, respectively, and the size of the color conversion layer may be smaller than a size of the light emitting device. An electronic apparatus according to various embodiments may include: a display panel comprising a substrate, a plurality of light sources including a light emitting device mounted on the substrate, a color conversion layer and a color filter layer stacked on the light emitting device, and an encapsulation structure, individually comprising: a reflective layer surrounding a side surface of the light source and configured to reflect light emitted from a side surface of the light source, a black matrix disposed on the reflective layer in a grating form, and a driving circuit, disposed on the substrate and configured to generate a driving signal of the plurality of light emitting devices; wherein the encapsulation structure may include a first inorganic film covering an upper surface, a side surface, and a lower surface of the color conversion layer.

According to various example embodiments of the disclosure, it is possible to improve the power consumption and image quality characteristics of the display module by applying a color conversion material (e.g., quantum dots, color filters) to the display module using a light emitting device (e.g., micro LED) that generates wavelength shift according to the current, and various effects directly or indirectly identified through this disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
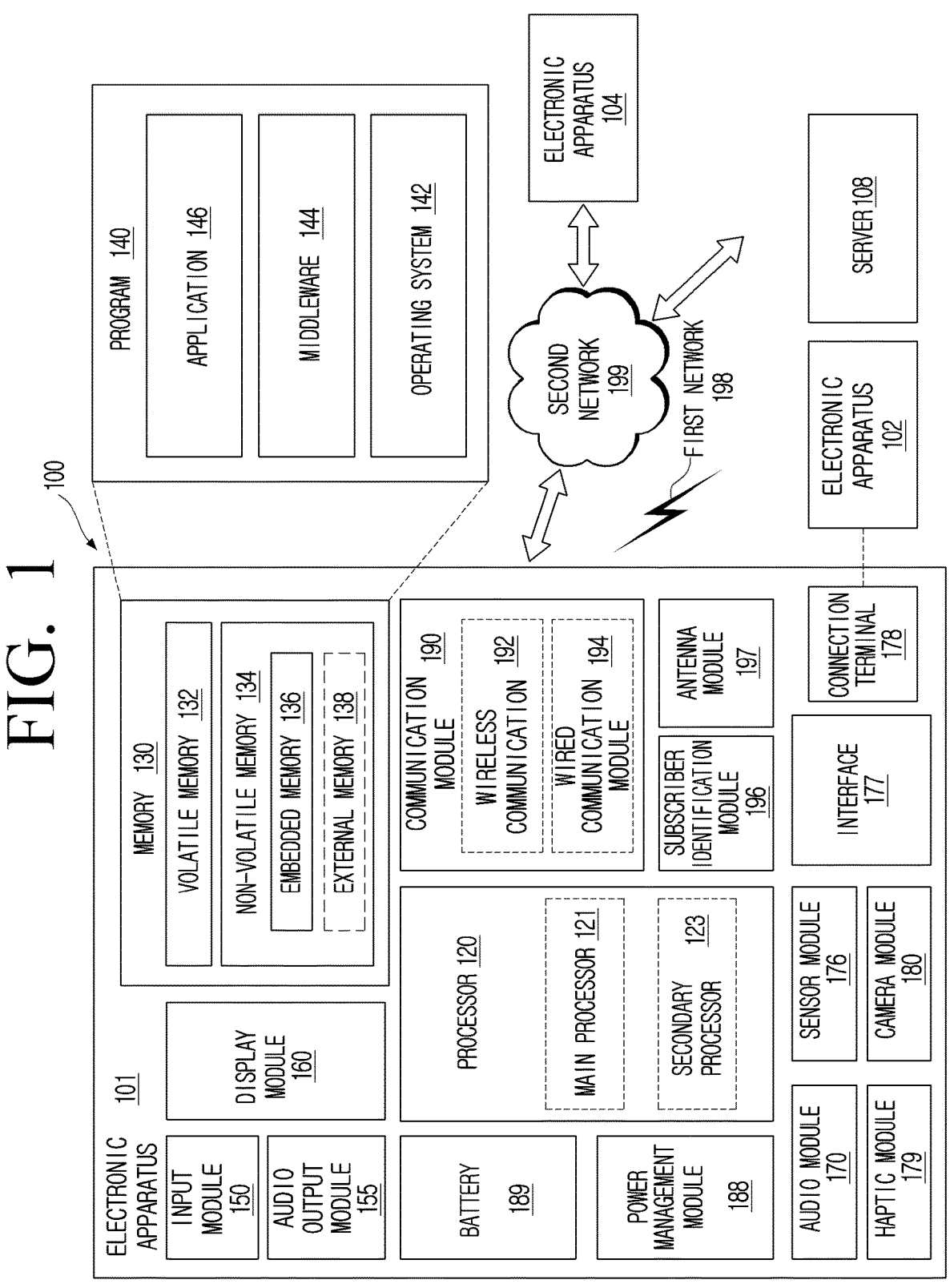
FIG. 1 is a block diagram illustrating an example electronic apparatus in a network environment according to various embodiments.

Terms used in the present disclosure are briefly described, and the disclosure will be described in greater detail. In describing the disclosure, the specific description of the related known-art may be omitted, and a duplicate description of the same of similar configurations may be omitted. The terms "cover", "on", "over", or the like may be understood to cover both directly and indirectly "on", "over", "covering", or the like, without or with other element(s) between the elements recited to "cover" be "on", "over", etc.

The terms used in the disclosure and the claims are general terms identified in consideration of the functions of embodiments of the disclosure. However, these terms may vary depending on intention, legal or technical interpretation, emergence of new technologies, and the like of those skilled in the related art. In addition, in some cases, a term may be selected, in which case the term will be described in detail in the description of the corresponding disclosure. Thus, the terms used in this disclosure should be defined based on the meaning of terms, not a simple name of the term, and the contents throughout this disclosure.

One or more embodiments of the disclosure are illustrated in the drawings and are described in greater detail in the detailed description. However, it is to be understood that the disclosure is not limited to the one or more example embodiments, but includes all modifications, equivalents, and substitutions without departing from the scope and spirit of the disclosure. Also, well-known functions or constructions may not be described in detail where they would obscure the disclosure with unnecessary detail.

In addition, expressions "first", "second", or the like, used in the disclosure may indicate various components, will be used simply in order to distinguish one component from the other components, and do not limit the corresponding components. For example, the first component may be named the second component and the second component may also be similarly named the first component, without departing from the scope of the disclosure.

A singular expression includes a plural expression, unless otherwise specified. It is to be understood that the terms such as "comprise" may, for example, be used to designate a presence of a characteristic, number, step, operation, element, component, or a combination thereof, and not to preclude a presence or a possibility of adding one or more of other characteristics, numbers, steps, operations, elements, components or a combination thereto.

Terms such as "module," "unit," "part," and so on are used to refer to an element that performs at least one function or operation, and such element may be implemented as hardware or software, or a combination of hardware and software. Further, except for when each of a plurality of "modules," "units," "parts," and the like needs to be realized in an individual hardware, the components may be integrated in at least one module or chip and be realized in at least one processor.

Embodiments of the disclosure will be described in greater detail with reference to the accompanying drawings to aid in the understanding of the disclosure. However, the disclosure may be realized in various different forms and it should be noted that the disclosure is not limited to the various embodiments described herein. Further, in the drawings, parts not relevant to the description may be omitted, and like reference numerals may be used to indicate like elements.

Further, the embodiments will be described in greater detail below with reference to the accompanying drawings, but it should be understood that the disclosure is not limited by the embodiments.

Hereinafter, the display module according to various example embodiments of this disclosure and an electronic apparatus including the same will be described in greater detail referring to the drawings.

FIG. 1 is a block diagram illustrating an example electronic apparatus in a network environment according to various embodiments of the disclosure.

FIG. 1 is a block diagram of an electronic apparatus 101 in a network environment 100 according to various embodiments of the disclosure. For convenience, a machine according to various embodiments of the disclosure is referred to as an "electronic apparatus", but a machine according to various embodiments may be an electronic apparatus, a wireless communication device, a display device, or a portable communication device.

Referring to FIG. 1, in the network environment 100, the electronic apparatus 101 may communicate with an electronic apparatus 102 via a first network 198 (e.g., a short-range wireless communication network) or communicate with an electronic apparatus 104 or a server 108 via a second network 199 (e.g., wide area network). According to an example embodiment, the electronic apparatus 101 may communicate with the electronic apparatus 104 via the server 108. According to an example embodiment, the electronic apparatus 101 may include a processor 120, a memory 130, an input device 150, an audio output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, or an antenna module 197. In various embodiments, at least one (e.g., connection terminal 178) of these components may be omitted from electronic apparatus 101, or one or more other components may be added. In various embodiments, some of these components (e.g., sensor module 176, camera module 180, or antenna module 197) may be implemented as a single component (e.g., a display module 160).

According to an embodiment, the electronic apparatus 101 may display various images. The image may include a still image and a moving image, and the electronic apparatus 101 may display various images, such as broadcast content, multimedia content, and the like. The electronic apparatus 101 may display a user interface (UI) and an icon. For example, the display module 160 (see FIG. 1) may include a display driver integrated circuit (IC) 230 (see FIG. 2) and may display an image based on an image signal received from the processor 120 (see FIG. 1). For example, the display driver IC 230 may generate a driving signal of a plurality of subpixels based on an image signal received from the processor 120, and display an image by controlling light emission of the plurality of subpixels based on the driving signal.

According to an embodiment, the processor 120 may include various processing circuitry and control the overall operation of the electronic apparatus 101. The processor 120 may be including one or a plurality of processors. For example, the processor 120 may perform the operation of the electronic apparatus 101 according to various embodiments of the disclosure by executing at least one instruction stored in the memory.

According to an embodiment, the processor 120 may be implemented, for example, and without limitation, as a digital signal processor (DSP), a microprocessor, a graphics processing unit (GPU), artificial intelligence (AI) processor, a neural processing unit (NPU), a time controller (TCON), or the like. However, the embodiments are not limited thereto, and may include, for example, and without limitation, one or more from among a central processing unit (CPU), a dedicated processor, a micro controller unit (MCU), a micro processing unit (MPU), a controller, an application processor (AP), a communication processor (CP), an ARM processor, or the like, or may be defined by the corresponding term. In addition, the processor 120 may be implemented as a System on Chip (SoC) or large scale integration (LSI) embedded with a processing algorithm, and may be implemented in the form of a field programmable gate array (FPGA).

According to an embodiment, the processor 120 may be configured to control a hardware connected to the processor 120 or software elements by operating an operating system or an application program, and perform various data processing and operations. Further, the processor 120 may be configured to load an instruction or data received from at least one from among the other elements in a volatile memory and process the loaded instruction or data, and store various data in a nonvolatile memory.

According to an embodiment, the processor 120 may execute software (e.g., program 140) to control at least one other component (e.g., hardware or software component) of the electronic apparatus 101 coupled to the processor 120, and may perform various data processing or operations. According to an embodiment, as at least a part of the data processing or operation, the processor 120 may store the command or data received from another component (e.g., the sensor module 176 or the communication module 190) to a volatile memory 132, process command or data stored in the volatile memory 132, and store the result data in a non-volatile memory 134. According to an example embodiment, the processor 120 may include a main processor 121 (e.g., a central processing unit or an application processor), or a secondary processor 123 (e.g., a graphics processing unit, a neural processing unit (NPU), an image signal processor, a sensor hub processor, or a communication processor) which may be operated together or independently. For example, if the electronic apparatus 101 includes a main processor 121 and a secondary processor 120, the secondary processor 123 may use less power than the main processor 121, or may be set to be specialized to a designated function. The secondary processor 123 may be implemented separately from, or as a part of, the main processor 121.

According to an embodiment, the secondary processor 123 may, in place of the main processor 121 while the main processor 121 is in an inactive state (for example: sleep) or along with the main processor 121 while the main processor 121 is in an active state (for example: execution of an application) control a part of the functions or states related to at least one component (for example: display module 160, the sensor module 176, or the communication module 190) among the components of the electronic apparatus 101. According to an example embodiment, the secondary processor 123 (e.g., an image signal processor or a communication processor) may be implemented as a part of a functionally related other components (e.g., camera module 180 or communication module 190). According to an embodiment, the secondary processor 123 (e.g., a neural network processing device) may include a hardware structure specialized for processing an artificial intelligence model. The artificial intelligence model may be generated through machine learning. Such learning may be performed, for example, by the electronic apparatus 101 in which an artificial intelligence model is performed, or may be performed via a separate server (e.g., server 108). The learning algorithms may include, but are not limited to, supervised learning, unsupervised learning, semi-supervised learning, or reinforcement learning. The artificial intelligence model may include a plurality of artificial neural network layers. The artificial neural network may be, but is not limited to, a deep neural network (DNN), a convolutional neural network (CNN), a recurrent neural network (RNN), a restricted Boltzmann machine, a deep belief network (DBN), a bi-directional recurrent deep neural network (BRDNN), deep Q-networks, or a combination of two or more thereof. The artificial intelligence model may additionally or alternatively include a software structure, in addition to the hardware structure.

According to an embodiment, the memory 130 may store various data used by at least one component (e.g., processor 120 or sensor module 176) of the electronic apparatus 101. The data may include, for example, software (e.g., program 140) and input data or output data related with software instructions. The memory 130 may include the volatile memory 132 or non-volatile memory 134.

According to an embodiment, the processor 120 may be stored in the memory 130 as software, and include, for example, an operating system 142, middleware 144, or an application 146.

According to an embodiment, the input module 150 may receive a command or data to be used for the components (e.g., processor 120) of the electronic apparatus 101 from the outside (e.g., user) of the electronic apparatus 101. The input module 150 may include, for example, a microphone, a mouse, or a keyboard (e.g., button), or a digital pen (e.g., a stylus pen).

According to an embodiment, the sound output module 155 may output a sound signal to the outside of the electronic apparatus 101. The sound output module 155 may include, for example, a speaker or a receiver. The speaker may be used for general purposes, such as multimedia playback or recording playback, and the receiver may be used to receive incoming calls. According to an example embodiment, the receiver may be implemented separately from, or as a part of, the speaker.

According to an embodiment, the display module 160 may visually provide information to an outside (e.g., user) of the electronic apparatus 101. The display module 160 may include, for example, a display, a hologram device, a projector, or a control circuit for controlling the device. According to an embodiment, the display module 160 may include a touch sensor 251 which is set to detect a touch or a pressure sensor which is set to measure intensity of power generated by the touch. A detailed structure of the display module 160 will be described in detail with reference to FIG. 2.

According to an embodiment, the audio module 170 may convert sound into an electric signal, or convert an electric signal to sound. According to an example embodiment, the audio module 170 may acquire sound through an input module 150, or output sound through the sound output module 155, or an external electronic apparatus (e.g., electronic apparatus 102) (e.g., speaker or headphone) which is directly or wirelessly connected to the electronic apparatus 101.

According to an embodiment, the sensor module 176 may detect the operation state of the electronic apparatus 101 (e.g., power or temperature), or an external environment state (e.g., a user state), and generate an electrical signal or a data value corresponding to the detected state. According to an embodiment, the sensor module 176 may include, for example, a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illumination sensor.

According to an embodiment, the interface 177 may support one or more designated protocols that may be used by the electronic apparatus 101 to be connected directly or wirelessly to an external electronic apparatus (e.g., electronic apparatus 102). According to an embodiment, the interface 177 may include, for example, a high definition multimedia interface (HDMI), a universal serial bus (USB) interface, a secure digital (SD) card interface, or an audio interface According to an embodiment, a connection terminal 178 may include a connector through which the electronic apparatus 101 may be physically connected to an external electronic apparatus (e.g., the electronic apparatus 102). According to an embodiment, the connection terminal 178 may include, for example, an HDMI connector, a USB connector, an SD card connector, or an audio connector (e.g., a headphone connector).

According to an embodiment, the haptic module 179 may convert an electrical signal into a mechanical stimulus (e.g., vibration or motion) or an electrical stimulus that a user may recognize through a tactile or kinesthetic sense. According to an embodiment, the haptic module 179 may include, for example, a motor, a piezoelectric element, or an electric stimulation device.

According to an embodiment, the camera module 180 may photograph a still image or a moving image. According to an embodiment, the camera module 180 may include one or more lenses, image sensors, image signal processors, or flashes.

According to an embodiment, the power management module 188 may manage power supplied to the electronic apparatus 101. According to an embodiment, the power management module 188 may be implemented as, for example, at least a part of power management integrated circuit (PMIC).

According to an embodiment, the battery 189 may supply power to at least one component of the electronic apparatus 101. According to an embodiment, the battery 189 may include, for example, a non-rechargeable primary battery, a rechargeable secondary battery, or a fuel cell.

According to an embodiment, the communication module 190 may support establishment of direct (e.g.: wired) communication channel between the electronic apparatus 101 and an external electronic apparatus (e.g., electronic apparatus 102, electronic apparatus 104, or server 108) or wireless communication channel, and communication through the established communication channels. The communication module 190 may include one or more communication processors which are operated independently of the processor 120 (e.g., application processor) and support direct (e.g., wired) communication or wireless communication. According to an embodiment, the communication module 190 may include a wireless communication module 192 (e.g., cellular communication module, near field wireless communication module, or global navigation satellite system (GNSS) communication module) or wired communication module 194 (e.g., local area network (LAN) communication module, or power line communication module). The corresponding communication module among these communication modules may communicate with an external electronic apparatus 104 via the first network 198 (e.g., Bluetooth, wireless fidelity (WiFi) direct or near field communication network such as infrared data association (IrDA)) or the second network 199 (e.g., telecommunication network such as cellular network, Internet, or computer network (e.g., LAN or WAN)). These types of communication modules may be incorporated into one component (e.g., a single chip) or implemented with a plurality of components (e.g., a plurality of chips) that are separate from each other. The wireless communication module 192 may confirm or authenticate the electronic apparatus 101 in the communication network such as the first network 198 or the second network 199 using the subscriber information (e.g., international mobile subscriber identity (IMSI)) stored in the subscriber identification module 196.

According to an embodiment, the wireless communication module 192 may support a 5G network and a next generation communication technology, e.g., new radio access technology (NR access technology) after a 4G network. The NR connection technology may support high-capacity data high-speed transmission (enhanced mobile broadband (eMBB)), terminal power minimization, massive machine type communications (mMTC), or ultra-reliable and low-latency communications (URLLC). The wireless communication module 192 may support a high frequency band (e.g., an mmWave band), for example, to achieve a high data transmission rate. The wireless communication module 192 may support technologies such as various technologies for securing performance in a high frequency band, e.g., beamforming, massive multiple-input and multiple-output (MIMO), full dimensional MIMO (FD-MIMO), array antenna, analog beam-forming, or large scale antenna. The wireless communication module 192 may support various requirements defined in the wearable electronic apparatus 101, the external electronic apparatus (e.g., the electronic apparatus 104) or the network system (e.g., the second network 199). According to an embodiment, the wireless communication module 192 may support a peak data rate (e.g., at least 20 Gbps) for realizing eMBB, a loss coverage (e.g., 164 dB or less) for mMTC implementation, or a U-plane latency (e.g., downlink (DL) and uplink (UL) by 0.5 ms or below, respectively, or round trip 1 ms or below) for URLLC implementation.

According to an embodiment, the antenna module 197 may transmit a signal or power to an external device (e.g., an external electronic apparatus) or receive a signal or power from the outside. According to an example embodiment, the antenna module 197 may include a plurality of antennas (e.g., array antenna) and at least one antenna suitable for a communication method used in a communication network, such as the first network 198 or the second network 199, may be selected from the plurality of antennas by, for example, the communication module 190.

According to an embodiment, the antenna module 197 may include a plurality of antennas (e.g., an array antenna), and according to an embodiment, the antenna module 197 may include an antenna comprising an electric conductor formed over a substrate (e.g., printed circuit board (PCB)) or a radiator made of a conductive pattern.

According to various embodiments, the antenna module 197 may form an mmWave antenna module. According to an embodiment, the mmWave antenna module may include a printed circuit board, a radio frequency integrated circuit (RFIC) disposed on or adjacent to a first surface (e.g., a lower surface) of the printed circuit board, and capable of supporting a designated high frequency band (e.g., an mmWave band), and a plurality of antennas (e.g., an array antenna) disposed adjacent to or adjacent to a second surface (e.g., top surface or side) of the printed circuit board and capable of transmitting or receiving a signal of the designated high frequency band. A specific structure of the antenna module 197 according to various embodiments will be described in greater detail below with reference to FIG. 3.

The signal or power may be transmitted or received between the communication module 190 and an external electronic apparatus via at least one antenna. According to some embodiments, other components (e.g., a radio frequency integrated circuit (RFIC)) other than the radiator may be further formed as part of the antenna module 197.

At least a part of the components may be interconnected through the communication method (e.g., bus, general purpose input and output (GPIO), serial peripheral interface (SPI), or mobile industry processor interface (MIPI)) among peripheral devices and exchange a signal (e.g., command or data) from each other.

The command or data may be transmitted or received between the electronic apparatus 101 and the external electronic apparatus 104 via the server 108 connected to the second network 199. Each of the external electronic apparatuses 102 and 104 may be devices which are the same or different types from the electronic apparatus 101. According to an embodiment, whole or a part of the operations executed by the electronic apparatus 101 may be executed by one or more external devices among the external electronic apparatuses 102, 104, or 108. For example, when the electronic apparatus 101 has to perform a function or service automatically, or in response to a request from a user or another device, the electronic apparatus 101 may request one or more external electronic apparatuses to perform at least a part of the function or the service instead of, or in addition to, performing the function or service by itself. The one or more external electronic apparatuses that have received the request may execute at least a portion of the requested function or service, or an additional function or service associated with the request, and transmit the result of the execution to the electronic apparatus 101. The electronic apparatus 101 may process the result as is or additionally, and provide the result as at least a portion of the response to the request. For this purpose, for example, cloud computing, distributed computing, or mobile edge computing (MEC), client-server computing technology may be used. The electronic apparatus 101 may provide ultra-low latency services using, for example, distributed computing or mobile edge computing. In an embodiment, the external electronic apparatus 104 may include an Internet of Things (IoT) device. The server 108 may be an intelligent server using machine learning and/or neural networks. According to an embodiment, the external electronic apparatus 104 or server 108 may be included in a second network 199. The electronic apparatus 101 may be applied to an intelligent service (for example, smart home, smart city, smart car, or health care) on the basis of 5G communication technology and IoT-related technology.

Figure 2:
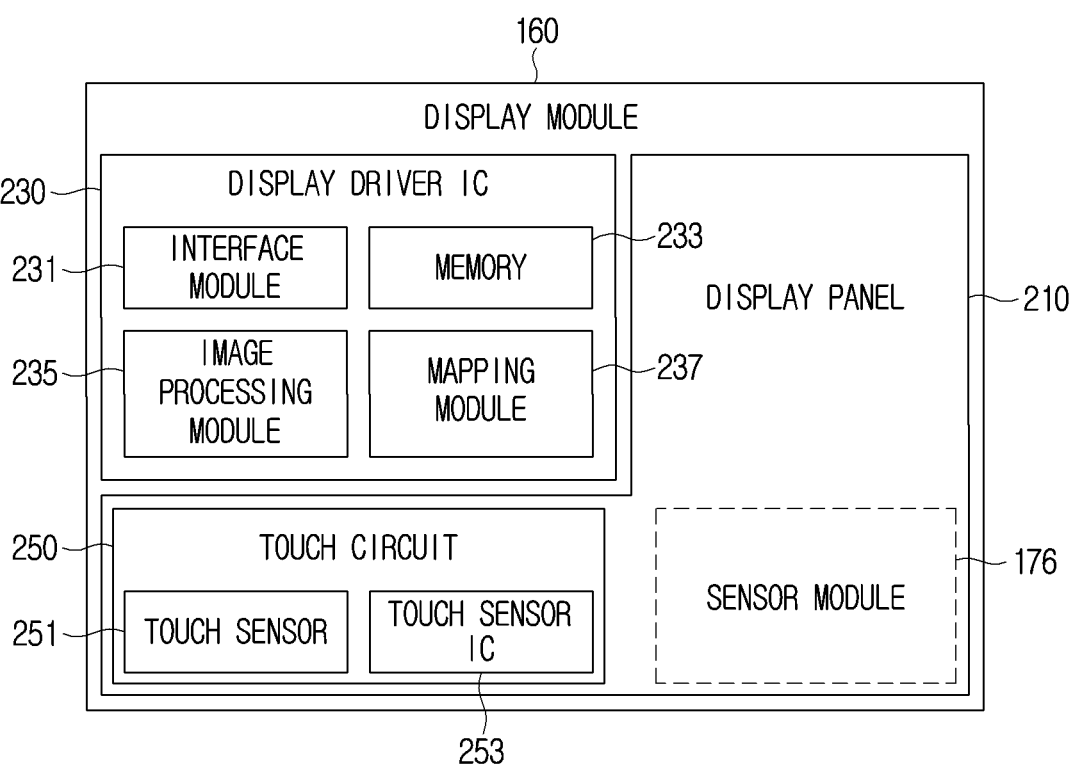
FIG. 2 is a block diagram illustrating an example configuration of a display module of an electronic apparatus according to various embodiments.

FIG. 2 is a block diagram illustrating an example configuration of a display module of an electronic apparatus according to various embodiments.

Referring to FIG. 2, the display module 160 may include the display panel 210 and a display driver IC (DDI) 230 for controlling the same.

The display driver IC 230 may include an interface module 231, a memory 233 (e.g. buffer memory), an image processing module 235, and/or a mapping module 237. Each of the various modules may include various processing circuitry and/or executable program instructions for carrying out the various functions enumerated by way of non-limiting example below. The display driver IC 230, for example, may receive image information containing image data, or an image control signal corresponding to a command for controlling the image data from another component of the electronic apparatus 101 through the interface module 231. According to an embodiment, image information may be received from the processor 120 (e.g., the main processor 121) (e.g., application processor) or the secondary processor 123 (e.g. graphics processing unit) operating independently of the function of the main processor 121.

The display driver IC 230 may communicate with the touch circuit 250 or the sensor module 176 through the interface module 231. The display driver IC 230 may store at least a portion of the received image information in the memory 233, for example, in a frame unit. The image processing module 235 may perform pre-processing or post-processing (e.g., resolution, brightness, or size adjustment) for at least a part of the image data based on at least one of the characteristics of the image data or characteristics of the display panel 210. The mapping module 237 may generate a voltage value or a current value corresponding to the image data pre-processed or post-processed through the image processing module 235. According to an embodiment, the generation of a voltage value or current value may be performed, for example, based at least in part on an attribute of pixels of the display panel 210 (e.g., an array of pixels (RGB stripe or PenTile structure), or a size of each of the subpixels). At least some pixels of the display panel 210 may, for example, be driven based at least in part on the voltage value or current value such that visual information (e.g., text, image, or icon) corresponding to the image data may be displayed via the display panel 210.

According to an embodiment, the display driver IC 230 may transmit a driving signal (e.g., a driver driving signal, a gate driving signal, etc.) to the display based on the image information received from the processor 120. The display driver IC 230 may operate such that the processor 120 operates by itself in a sleep mode to display various information (e.g., current time, message reception status, etc.).

According to an embodiment, the display module 160 may further include a touch circuit 250. The touch circuit 250 may include a touch sensor 251 and a touch sensor IC 253 for controlling the same. The touch sensor IC 253 may, for example, control the touch sensor 251 to detect a touch input or hovering input for the designated position of the display panel 210. For example, the touch sensor IC 253 may detect a touch input or hovering input by measuring the change in the signal (e.g., voltage, light amount, resistance, or charge) for the designated position of the display panel 210. The touch sensor IC 253 may provide information about the detected touch input or hovering input (e.g., location, area, pressure, or time) to the processor 120. According to an embodiment, at least part of the touch circuit 250 (e.g. touch sensor IC 253) may be included as part of the display driver IC 230, or as part of the display panel 210, or other components placed outside of the display module 160 (e.g., secondary processor 123).

According to an embodiment, the display module 160 may further include at least one sensor (e.g., fingerprint sensor, iris sensor, pressure sensor or illumination sensor) of the sensor module 176, or may further include a control circuit. In this example, at least one sensor or the control circuit thereof may be embedded in a portion of the display module 160 (e.g., the display panel 210 or the display driver IC 230) or a portion of the touch circuit 250. For example, when the sensor module 176 embedded in the display module 160 includes a biometric sensor (e.g. fingerprint sensor), the biometric sensor may obtain biometric information (e.g., fingerprint image) associated with the touch input through some area of the display panel 210. For another example, when the sensor module 176 embedded in the display module 160 includes a pressure sensor, the pressure sensor may obtain pressure information associated with the touch input through a portion or the entire area of the display panel 210. According to an embodiment, the touch sensor 251 or the sensor module 176 may be placed between pixels of the pixel layer of the display panel 210, or above or below the pixel layer.

According to an embodiment, the processor (e.g., the processor 120 of FIG. 1) may transmit various information from the processor 120 to each module and then may be shifted to an inactivated state. The processor 120 may be inactivated in an always on display (AOD) mode. The processor 120 may maintain the inactivated state in the AOD mode and when image information and/or control information is transferred to the display driver IC 230, the touch sensor IC 253, and the pressure sensor IC (not shown), the processor 120 may be activated for transmitting information and then may be inactivated again.

According to an embodiment, the display driver IC 230 may transmit a driving signal (e.g., a driver driving signal, a gate driving signal, etc.) to the display based on the image information received from the processor 120. The display driver IC 230 may operate such that the processor 120 itself operates in a sleep mode to display various information (e.g., current time, message reception status, etc.).

The electronic apparatus according to various embodiments disclosed in the disclosure may be of various types of devices. The electronic apparatus may include, for example, a portable communication device (e.g., a smartphone), a computer device, a portable multimedia device, a portable medical device, a camera, a wearable device, a home appliance, or the like. The electronic apparatus according to an embodiment of the disclosure is not limited to the above-described devices.

It is to be understood that the various embodiments of the disclosure and the terms used therefor are not intended to limit the technical features set forth in the disclosure to particular embodiments, and should be understood to include various changes, equivalents, or alternatives of the embodiment. In connection with the description of the drawings, similar reference numerals may be used for similar or related components. The singular type of noun corresponding to the item may include one or plural items, unless explicitly differently directed in the relevant context. In this disclosure, each of the phrases such as "A or B", "at least one of A or B", "at least one of A, B or C", "at least one of A, B and C", and "at least one of A, B, or C" may include any one of the items listed together in the corresponding phrase, or all possible combinations thereof. Terms such as "first", "second" may simply be used to distinguish the component from other components and are not limited to other aspects (e.g., importance or order). If any (e.g., first) component is referred to in another component, with or without the term "functionally" or "communicatively", "coupled" or "connected", any of the components may be connected directly (e.g. by wire), wirelessly, or through a third component to the other components above.

The term or "module" used in the disclosure includes units including hardware, software, or firmware, or any combination thereof, and is used interchangeably with terms such as, for example, logic, logic blocks, parts, or circuits. A "module" may be an integrally constructed component or a minimum unit or part thereof that performs one or more functions. For example, the module may be configured as an application-specific integrated circuit (ASIC).

The various embodiments of the disclosure may be implemented with software (e.g., program 140) including one or more instructions stored in the storage medium (e.g., internal memory 136 or external memory 138) readable by a machine (e.g., electronic apparatus 101). For example, the processor (e.g., processor 120) of a device (e.g., electronic apparatus 101) may call at least one instruction among one or more instructions stored in the storage medium and execute the instructions. This enables a device to be operated to perform at least one function according to the called at least one instructions. The instructions may include a code generated by a compiler or a code executable by an interpreter. The storage medium readable by a machine may be provided in the form of a non-transitory storage medium that is a tangible device and may not include a signal (e.g., electromagnetic wave). This term does not distinguish that data is permanently or temporarily stored in the storage medium.

According to an embodiment, the method according to various embodiments disclosed herein may be provided in a computer program product. A computer program product may be exchanged between a seller and a purchaser as a commodity. A computer program product may be distributed in the form of a machine-readable storage medium (e.g., compact disc read only memory (CD-ROM)) or distributed online through an application store (e.g. PlayStore™) directly between two user devices (e.g., smartphones). In the case of on-line distribution, at least a portion of the computer program product may be stored temporarily or at least temporarily in a storage medium such as a manufacturer's server, a server of an application store, or a memory of a relay server.

According to various embodiments, each component (e.g., a module or program) of the components described above may include a single or a plurality of entities, and some of the plurality of entities may be separately arranged in other components. According to various embodiments, one or more of the aforementioned components or operations may be omitted, or one or more other components or operations may be added. Alternatively or additionally, a plurality of elements (e.g., a module or a program) may be comprised of a single element. In this case, the integrated component may perform one or more functions of each component of each of the plurality of components equal to or similar to those performed by the components of the plurality of components prior to the integration. Operations performed by a module, a program, or another element, in accordance with various embodiments, may be performed sequentially, in a parallel, repetitively, or in a heuristically manner, or at least some operations may be performed in a different order, omitted or one or more different operations may be added.

The electronic apparatus 101 according to an embodiment of the disclosure may be configured in a single unit, and may be installed in an electronic product or electric field such as a wearable device, a portable device, a handheld device, or a wireless communication device. In addition, the electronic apparatus 101 of an embodiment may be implemented, for example, and without limitation, as a TV, or a device having a display function such as a video wall, a large format display (LFD), a digital sign board (digital sign), a digital information display (DID), a projector display, and the like.

The electronic apparatus 101 according to an embodiment of the disclosure may be implemented in a matrix type with multiple display modules 160, through a plurality of assembly arrangements, monitors for a PC (personal computer), high-resolution TVs and signage (or, digital signage), electronic displays may also be applied to various display devices. However, the disclosure is not limited to these example devices.

Figure 3:
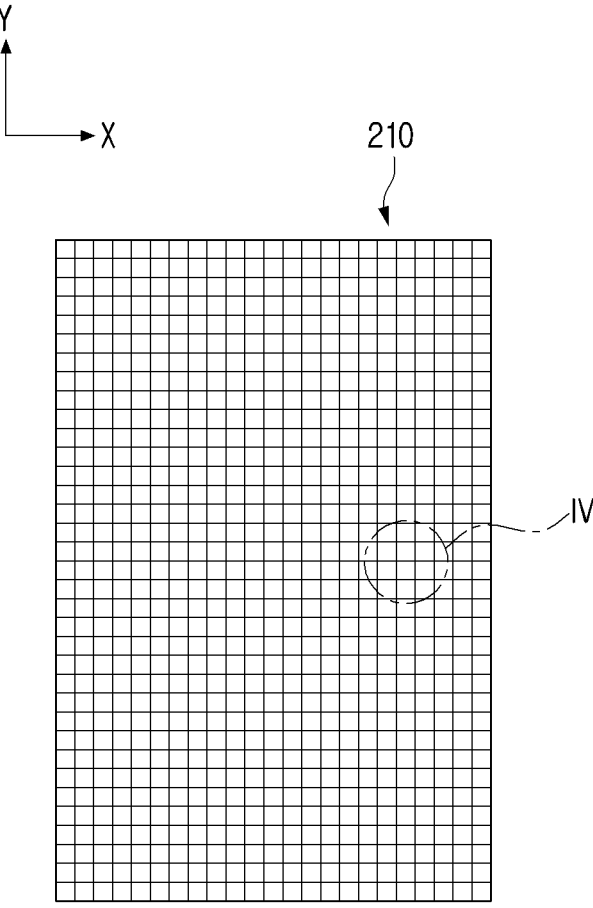
FIG. 3 is a diagram illustrating an example display panel according to various embodiments.
Figure 4:
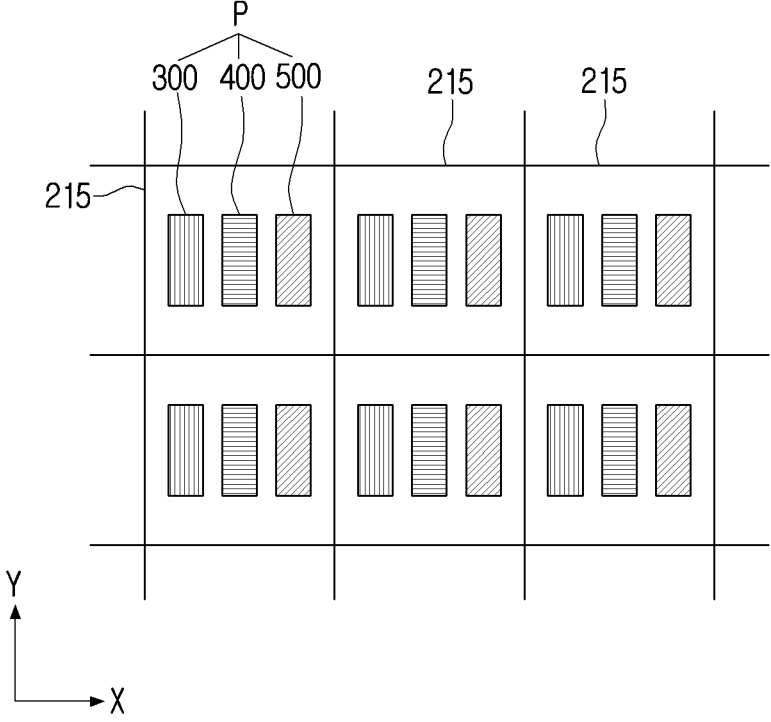
FIG. 4 is a diagram illustrating an example pixel structure of a display by enlarging IV portion of FIG. 3 according to various embodiments.
Figure 5A:
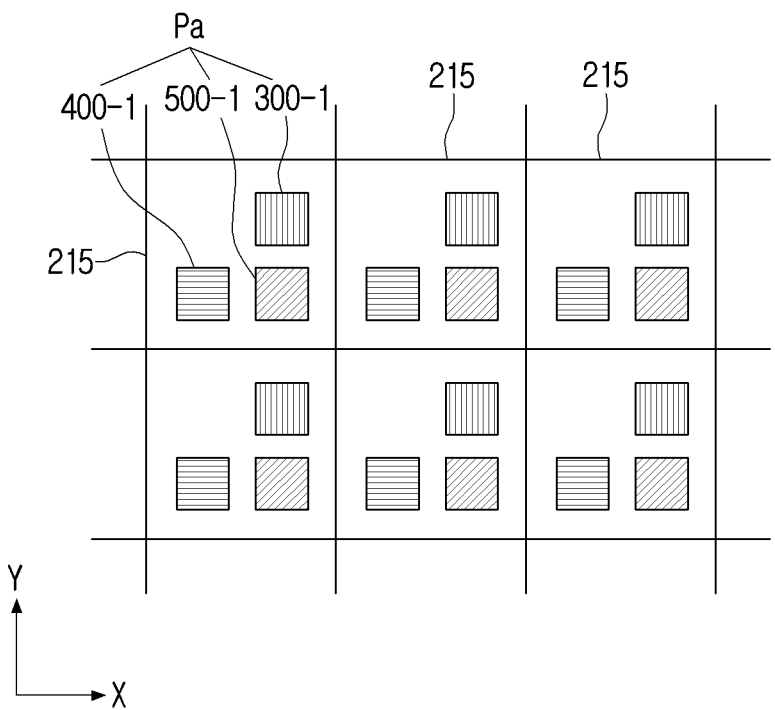
FIG. 5A is a diagram illustrating an example arrangement different from the arrangement of subpixels of FIG. 4 according to various embodiments.
Figure 5B:
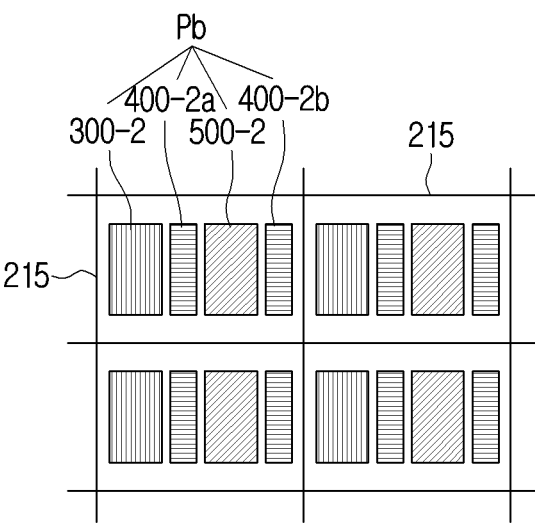
FIG. 5B is a diagram illustrating an example arrangement different from the arrangement of subpixels of FIG. 4 according to various embodiments.
Figure 5C:
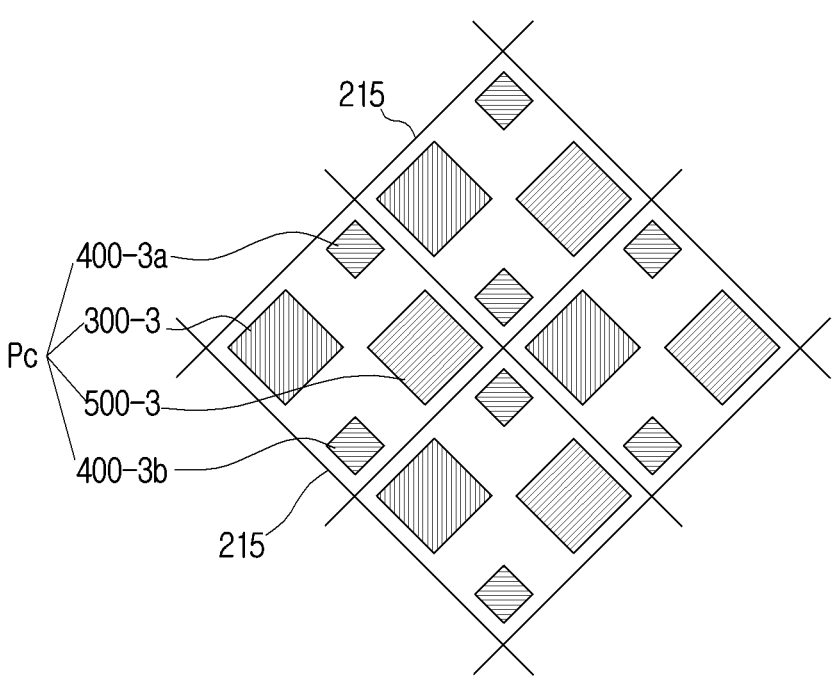
FIG. 5C is a diagram illustrating an example arrangement different from the arrangement of subpixels of FIG. 4 according to various embodiments.

FIG. 3 is a diagram illustrating an example display panel according to various embodiments; FIG. 4 is a diagram illustrating an example pixel structure of a display by enlarging IV portion of FIG. 3 according to various embodiments; FIGS. 5A, 5B and 5C are diagrams illustrating an example arrangement different from the arrangement of subpixels of FIG. 4 according to various embodiments.

Referring to FIGS. 3 and 4, the display panel 210 may include a plurality of pixel area 215 arranged in a matrix form. Each pixel area 215 may be arranged with one pixel (P). The one pixel (P) may include three subpixels 300, 400, and 500. For example, the one pixel (P) may include a subpixel 300 that emits red (R) light, a subpixel 400 that emits green (G) light, and a subpixel 500 that emits blue (B) light. In the disclosure, one subpixel may be referred to as one light source.

In an area where three subpixels 300, 400, 500 are not occupied in the one pixel area 215, a plurality of thin film transistors (TFT) for driving three subpixels 300, 400, 500 may be disposed.

In the disclosure, the subpixels 300, 400, and 500 are arranged in a line as shown in FIG. 4 in one pixel area 215, but the disclosure is not limited thereto. For example, as shown in FIG. 5A, the three subpixels 300-1, 400-1, and 500-1 of one pixel Pa in one pixel region 215 may be arranged in various shapes, such as in the form of an L-shaped frame where left and right are reversed.

Referring to FIGS. 5B and 5C, a number of pixels may be arranged in a PenTile RGBG scheme. The PenTile RGBG scheme is a method for arranging the number of red, green, and blue subpixels in a ratio of 1:2:1 (RGBG) using a characteristic that a human may identify blue less and identify green most well. The PenTile RGBG scheme is effective in increasing the yield, lowering the unit cost, and implementing high resolution on a small screen.

In the PenTile RGBG scheme, for example, one pixel (Pb) may include four subpixels 300-2, 400-2a, 400-2b and 500-2 as illustrated in FIG. 5B. In this example, the red subpixel 300-2 and the blue subpixel 500-2 may have the same or similar size, and the first and second green subpixels 400-2a, 400-2b may have a size smaller than then red subpixel 300-2 and the blue subpixel 500-2. The arrangement of a subpixel in one pixel (Pb) may be disposed in an order of, for example, the red subpixel 300-2, first green subpixel 400-2a, blue subpixel 500-2, second green subpixel 400-2b. The PenTile RGBG scheme may include four subpixels 300-3, 400-3a, 400-3b, 500-3 as illustrated, for example, in FIG. 5C. The first and second green subpixels 400-3a, 400-3b may be disposed between the red subpixel 300-3 and blue subpixel 500-3 vertically symmetrically.

The display panel 210 in the disclosure may be implemented, for example, and without limitation, as a touch screen coupled with a touch sensor, a flexible display, a rollable display, a 3D display and/or a display in which a plurality of display modules are physically connected, or the like.

The display panel 210 according to the disclosure may include a substrate that may be implemented as a type such as, for example, and without limitation, amorphous silicon (a-Si) TFT, low temperature polycrystalline silicon (LTPS) TFT, low temperature polycrystalline oxide (LTPO) TFT, hybrid oxide and polycrystalline silicon (HOP) TFT, liquid crystalline polymer (LCP) TFT, organic TFT (OTFT), or the like.

The display panel 210 according to the disclosure may include a plurality of pixels mounted on the substrate (e.g., the substrate 221 of FIG. 6) and the substrate 221. Each pixel may include a subpixel that emits at least two different colors, for example, three subpixels 300, 400, 500 in which one pixel emits red, green, and blue light. The subpixels 300, 400, 500 may each have an individual encapsulation structure.

Hereinafter, a structure of the display panel 210 with respect to the structure of one subpixel 300 among three subpixels will be described in greater detail with reference to the drawings.

Figure 6:
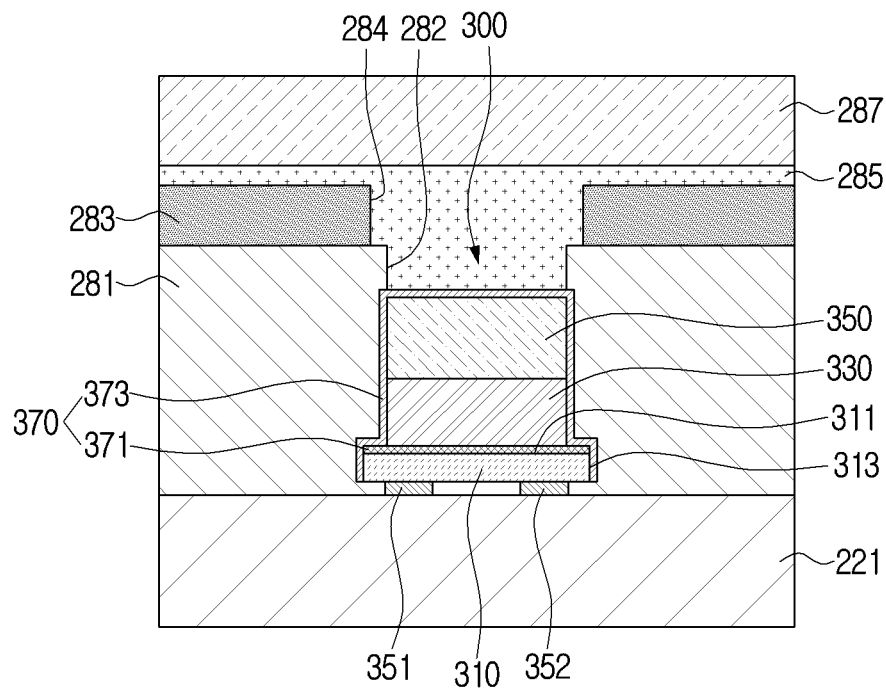
FIG. 6 is a cross-sectional view illustrating an example subpixel structure of a display panel according to various embodiments.

FIG. 6 is a cross-sectional view illustrating an example subpixel structure of a display panel according to various embodiments.

Referring to FIG. 6, the substrate 221 may be made of a transparent glass material (principal component is $SiO_2$). However, the embodiment is not limited thereto, and may be formed of a transparent or translucent polymer. In this example, the polymer may be an insulating organic material such as, for example, and without limitation, polyether sulfone (PES), polyimide (PI), polyethylene terephthalate (PET), polyethylene naphthalate (PEN), polycarbonate (PC), and the like.

According to an embodiment, the substrate 221 is provided with a plurality of TFTs (not shown). In the disclosure, the TFT is not limited to a specific structure or type. For example, the TFT of the disclosure may include a substrate that may be implemented as a type such as, for example, and without limitation, low temperature polycrystalline silicon (LTPS) TFT, oxide TFT, amorphous silicon (a-Si) TFT, OTFT, graphene TFT, or the like.

According to an embodiment, the subpixel 300 mounted on the substrate 221 may include a light-emitting device 310, a color conversion layer 330, a color filter layer 350, and an encapsulation structure 370.

According to an embodiment, the light-emitting device 310 may include, for example, and without limitation, a micro light emitting diode (LED), having a size of about 50 μm or less, that emits light in blue wavelength as an inorganic light-emitting device. In this example, the micro LED may be a flip chip type in which a positive electrode 351 and a negative electrode 352 are disposed on the opposite surface of the light emitting surface 311. However, the embodiment is not limited thereto, and may include a lateral chip type or a vertical chip type. According to an embodiment, each light emitting device of the second and third subpixels 400, 500 may be applied, for example, with a micro LED emitting blue light as the light-emitting device of the first subpixel 300.

The first subpixel 300 may include a color conversion material (e.g., a red phosphor, a red quantum dot, etc.) to emit red light using green light as excitation light. The third subpixel 500 may include a color conversion material (e.g., a blue phosphor, a blue quantum dot, etc.) to emit blue light using green light as excitation light.

A light emitting device of the first subpixel 300 may apply a micro LED emitting blue or green light. The second subpixel 400 may apply a micro LED that emits green light. The third subpixel 500 may apply a micro LED that emits blue light. In this example, the first subpixel 300 may include a color conversion material (e.g., a red phosphor, a red quantum dot, etc.) to emit red light with blue or green light as an excitation light.

According to an embodiment, the light emitting device 310 may include a first semiconductor layer, a second semiconductor layer, and an active layer placed between the first semiconductor layer and the second semiconductor layer, respectively.

According to an embodiment, the first semiconductor layer, the active layer, and the second semiconductor layer may be formed using methods such as, for example, and without limitation, metal organic chemical vapor deposition (MOCVD), chemical vapor deposition (CVD), plasma-enhanced chemical vapor deposition (PECVD), and the like.

According to an embodiment, the first semiconductor layer may include, for example, and without limitation, a p-type semiconductor layer (anode, an oxidizing electrode). The p-type semiconductor layer may be selected from, for example, and without limitation, GaN, AlN, AlGaN, InGaN, InN, InAlGaN, AlInN, and the like, and p-type dopants such as, for example, and without limitation, Mg, Zn, Ca, Sr, Ba, etc. may be doped.

According to an embodiment, the second semiconductor layer may include, for example, and without limitation, an n-type semiconductor layer (cathode, a reduction electrode). The n-type semiconductor layer may be selected from, for example, and without limitation, GaN, AlN, AlGaN, InGaN, InN, InAlGaN, AlInN, and the like, and n-type dopants such as, for example, and without limitation, Si, Ge, Sn, etc. may be doped. The light-emitting device is not limited to the above configuration, and for example, the first semiconductor layer may include an n-type semiconductor layer, and the second semiconductor layer may include a p-type semiconductor layer. The active layer is an area where electrons and holes are recombined and may transition to a low energy level according to the recombination of electrons and holes, and generate light having a corresponding wavelength.

According to an embodiment, the active layer may include semiconductor materials, such as, for example, and without limitation, amorphous silicon or poly crystalline silicon. However, this embodiment may contain organic semiconductor materials, etc., and may be formed, for example, and without limitation, of a single quantum well (SQW) structure or multiple quantum well (MQW) structure.

According to an embodiment, in the light emitting device 310, the first electrode 351 and the second electrode 352 may be disposed on the opposite surface of the light emitting surface 311. If the first electrode 351 is an anode electrode, the second electrode 352 may be a cathode electrode. The first and second electrodes 351, 352 may be made of, for example, and without limitation, Au or an alloy containing Au, but is not limited thereto.

According to an embodiment, the first inorganic film 371 forms a part of the encapsulation structure 370 and covers the entire light emitting surface 311 of the light emitting device 310. However, the embodiment is not limited thereto, and the first inorganic film 371 may cover the entire light emitting surface 311 of the light emitting device 310 and at least a part of the side surface 313 of the light emitting device 310. The first inorganic film 371 may cover the lower surface of the color conversion layer 330, which will be described in greater detail below, and may protect the color conversion layer 330 from humidity and oxygen contained in the air to prevent and/or reduce a browning phenomenon of the color conversion layer 330.

According to an embodiment, an organic film (not shown) may be stacked on the first inorganic film 371. An organic film (not shown) and another inorganic film (not shown) may be sequentially stacked on the first inorganic film 371 to provide a multi-layered structure of a plurality of inorganic films and organic films. A multi-layered structure in which at least two organic films and at least two inorganic films alternately stacked on an upper portion of the first inorganic film 371 may be provided.

According to an embodiment, the color conversion layer 330 is placed on a first inorganic film 371 to cover at least part of the first inorganic film 371. For example, when the first inorganic film 371 covers the entire light emitting surface 311 of the light emitting device 310, the color conversion layer 330 may cover the rest except the periphery of the first inorganic film 371 as shown in FIG. 6. Accordingly, the area of the color conversion layer 330 may be less than the area of the light emitting surface 311 of the light emitting device.

According to an embodiment, the color conversion layer 330 may be excited by the light emitted from the light emitting device 310 to be able to emit the light of the red wavelength band. For example, the color conversion layer 330 may convert the light (e.g., blue light emitted from the light emitting device 310) incident to the color conversion layer 330, including quantum dot and photosensitive resin, to red. Quantum dots may be excited by the light incident into the color conversion layer 330 and emit red light. In detail, the quantum dot may absorb incident light having a wavelength of blue light, and may emit red light having a wavelength of a band longer than the incident light is isotropic. The photosensitive resins may be made of materials with light permeability, for example, silicon resins, epoxy resins, acrylate, siloxane-based or photo-permeable organic materials.

According to an embodiment, the color filter layer 350 may cover the entire upper surface of the color conversion layer 330. The color filter layer 350 may be an organic material comprising a dye or pigment. The color filter layer 350 may selectively transmit red light emitted from the color conversion layer 330.

According to an embodiment, the second inorganic film 373 may form an encapsulation structure 370 with the first inorganic film 371 described above. The second inorganic film 373 may cover an upper surface and a side surface of the color filter layer 350, a side surface of the color conversion layer 330, a portion (periphery) of the first inorganic film 371, and a side surface 313 of the light emitting device 310.

According to an embodiment, an organic film (not shown) and another inorganic film (not shown) may be sequentially stacked on the second inorganic film 373 to provide a multi-layered structure of a plurality of inorganic films and organic films. A multi-layered structure that at least two organic films and at least two inorganic films\alternately stacked on the second inorganic film 373 may be provided.

As described above, since the second inorganic film 373 directly covers the side surface of the color conversion layer 330 and covers the upper surface and the side surface of the color filter layer 350, it is possible to prevent and/or reduce moisture and oxygen contained in the air from penetrating the upper surface and the side surface of the color conversion layer 330.

According to the disclosure, a plurality of subpixels arranged on the substrate 221 at a predetermined (e.g., specified) pitch may each include a thin film encapsulation structure 370. Since each subpixel includes an inorganic light-emitting device and a color conversion layer together, it is possible to reduce power consumption and fundamentally prevent and/or reduce moisture and oxygen from penetrating into the color conversion layer by the encapsulation structure 370, thereby improving the color reproduction rate of the display.

The subpixel 300 may be tightly surrounded by a reflective layer 281 formed on the substrate 221.

According to an embodiment, the reflective layer 281 is formed to surround the subpixel 300 and may not cover the upper surface of the subpixel 300 (the surface from which light is emitted from the subpixel 300). However, the reflective layer 281 may cover at least a portion of the upper surface of the subpixel 300. The reflective layer 281 is in close contact with the side of the second inorganic layer 373.

According to an embodiment, the reflective layer 281 may be formed with an opening 282 at a position corresponding to the subpixels mounted on the substrate 221 through a predetermined (e.g., specified) patterning process. The reflective layer 281 may have an upper surface positioned higher than an upper surface of the subpixel 300.

According to an embodiment, the reflective layer 281 may be made of a material having a high reflectivity capable of refracting and reflecting light emitted from a side of the subpixel 300. The light emitted from the side of the subpixel 300 and the light emitted from the upper surface of the subpixel 300 may be reflected on the inner wall of the opening 282 of the reflective layer 281 to be emitted toward the front surface of the display panel 210. The light emitted from the side surface of the subpixel 300 may be refracted and reflected by the reflective layer 281 and the light-emitting direction may face the front surface of the display panel 210, thereby minimizing and/or reducing wasted light and improving luminance.

In the disclosure, the reflective layer 281 may function as a planarization layer to form a black matrix 283 upward of the subpixel 300.

According to an embodiment, the black matrix 283 may be disposed on an upper surface of the reflective layer 281 in, for example, a grating form. As the black matrix 283 is formed in the grating form, a plurality of cells 284 may be formed. Each cell 284 may be disposed at a location corresponding to each opening 282 of the reflective layer 281, and may partition each subpixel region. The light emitted from the upper surface of the subpixel 300 may pass through a cell 284 of the black matrix 283 and may be emitted toward the front surface of the display panel 210.

According to an embodiment, the black matrix 283 may absorb external light to address a problem due to reflection of external light, thereby improving aspect ratio and black visibility of the display and improving outdoor visibility. The black matrix 283 may prevent and/or reduce light from being mixed with different colors emitted from the adjacent light emitting devices, thereby improving the color reproduction rate of the display.

According to an embodiment, a transparent cover 287 may be attached to an upper portion of the black matrix 283 through an optical adhesive layer 285. It is described that the black matrix 283 is disposed on the reflective layer 281 in an embodiment of the disclosure, the black matrix 283 may be provided on an upper surface of the transparent cover 287. In this example, the black matrix 283 may not be disposed on the reflective layer 281.

According to an embodiment, when applying a display module according to the disclosure to an augmented reality (AR) wearable device (e.g., AR glass, etc.), it is not necessary to consider that the internal circuitry or wiring of the display module is visible due to external light reflection, since the light emitting direction is directed at the user or the light of the light emitting device (e.g. micro LED) placed on the glass frames of the AR wearable device is projected into the lens. Accordingly, the display module according to the disclosure may not include the black matrix 283 for preventing and/or reducing external light reflection. For example, the display module according to the disclosure may omit the black matrix 283 disposed on an upper surface of the reflective layer 281 or on an upper surface of the transparent cover 287. According to an embodiment, the optical adhesive layer 285 may include a material that is hardened in response to light (e.g., ultraviolet rays) of a designated bandwidth, and may include, for example, and without limitation, an optical clear adhesive (OCA), an optical clear resin (OCR), a super view resin (SVR), or the like. The optical adhesive layer 285 may include a material capable of maintaining high transparency even in a high temperature or high humidity environment. The optical adhesive layer 285 may include a material having a high oxygen and moisture blocking rate, and may play a role at least similar or identical to the encapsulation structure 370.

According to an embodiment, the transparent cover 287 may be disposed to cover the black matrix 283 to protect the black matrix 283 and the subpixel 300. The transparent cover 287 may be made, for example, and without limitation, of a tempered glass or a transparent optical film having a predetermined (e.g., specified) rigidity. The transparent cover 287 may be made of a material that does not affect or minimize and/or reduce the transmittance, reflectivity, and refractive index of light emitted from the subpixel 300.

Hereinafter, a process of manufacturing a display panel according to an embodiment will be described in greater detail with reference to the drawings.

Figure 7:
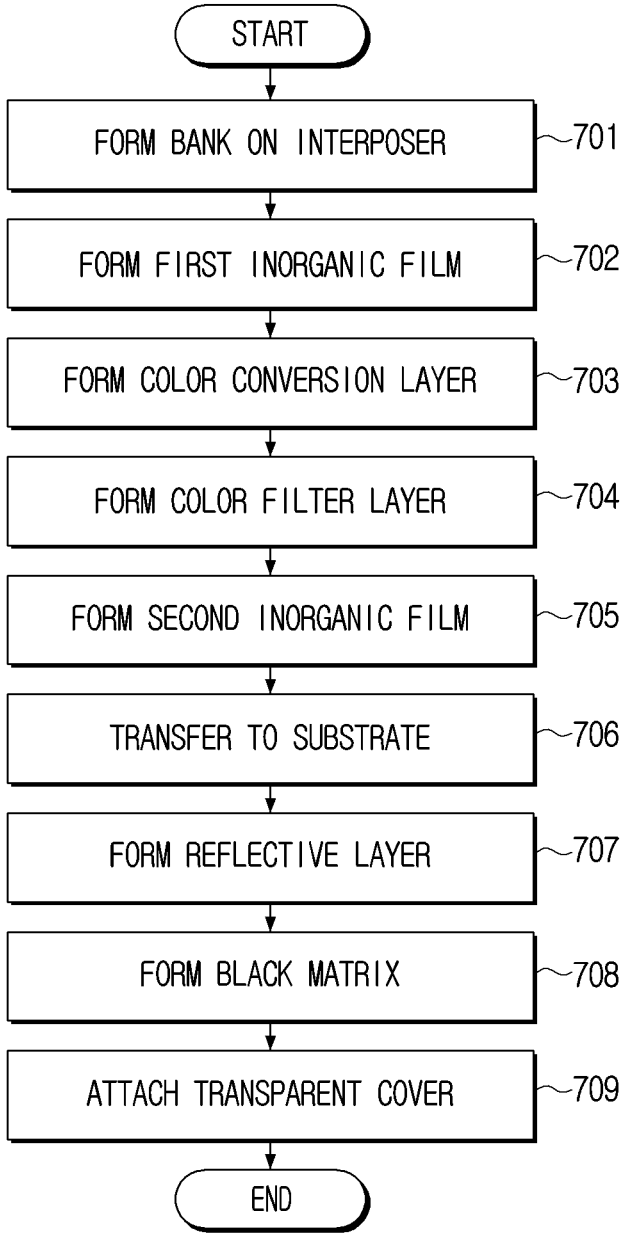
FIG. 7 is a flowchart illustrating an example process of manufacturing a display panel according to various embodiments.

FIG. 7 is a flowchart illustrating an example process of manufacturing a display panel according to various embodiments; FIGS. 8A, 8B, 8C, 8D, 8E, 8F, 8G, 8H, 8I, 8J and 8L are diagrams illustrating an example process of manufacturing a display panel according to various embodiments. FIGS. 8A to 8F are process maps illustrating a process of forming the subpixel 300 having the encapsulation structure 370, and FIGS. 8G to 8L are process maps illustrating a process of transferring the subpixel 300 on the substrate 221.

Referring to FIGS. 8A to 8F, a process of manufacturing the subpixel 300 including the encapsulation structure 370 will be described in greater detail.

Figure 8A:
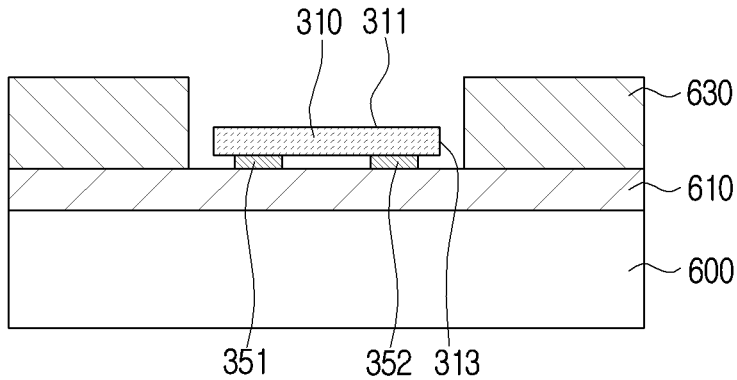
FIGS. 8A, 8B, 8C, 8D, 8E, 8F, 8G, 8H, 8I, 8J, 8K and 8L are diagrams illustrating an example process of manufacturing a display panel according to various embodiments.

Referring to FIG. 8A, on a relay substrate (interposer) 600, an adhesive layer 610 for the subpixel (e.g., subpixel 300 of FIG. 7F) to be detachably attached from the interposer 600 may be formed at a predetermined (e.g., specified) thickness. The interposer 600 may use, for example, and without limitation, a sapphire Al2O3 substrate or a silicon (Si) substrate, a silicon carbide (SiC) substrate, an MN substrate, a Si—Al substrate, a nitride substrate, or the like. The adhesive layer 610 may include polyimide (PI).

The light emitting device 310 may be fixed to the interposer 600 by attaching a pair of electrodes 351 and 352 to the adhesive layer 610. Although only one light emitting device 310 is illustrated in FIG. 8A, a plurality of light emitting devices may be disposed at regular intervals in the interposer 600. The interval between the light-emitting devices may take into account the width of a bank 630 to be formed between the light-emitting devices.

The bank 630 may be patterned in a grating pattern on the interposer 600 (701 of FIG. 7). The height (or thickness) of the bank 630 may be formed to be higher than the height of the light emitting device 310.

Figure 8B:
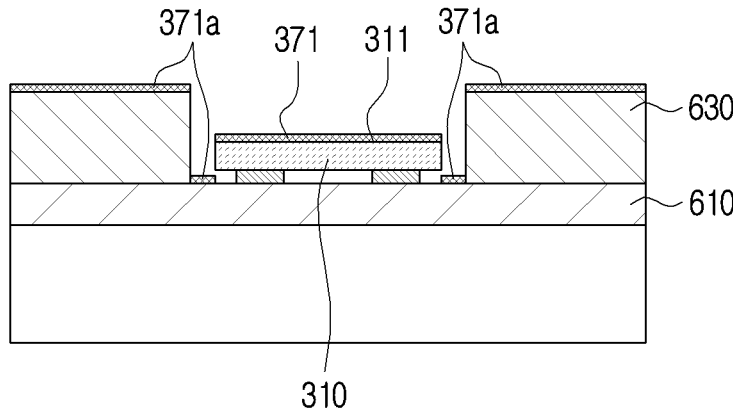

Referring to FIG. 8B, an inorganic thin film 371a to form the first inorganic film 371 may be deposited on the light emitting surface 311 of the light emitting device 310, an upper portion of the bank 630, and a portion of the adhesive layer 610 exposed through a space apart between the bank 630 and the light emitting device 310.

For a deposition process of the inorganic thin film 371a, physical vapor deposition (PVD), metal organic chemical vapor deposition (MOCVD), chemical vapor deposition (CVD), plasma-enhanced chemical vapor deposition (PECVD), and the like, may be used, but is not limited thereto.

The inorganic thin film 371a formed on the light emitting surface 311 of the light emitting device 310 may be used as the first inorganic film 371, and the inorganic thin film 371a formed in the rest may be removed through the following process.

The first inorganic film 371 may be formed to cover the entire light emitting surface 311 of the light emitting device 310 (702 of FIG. 7).

Figure 8C:
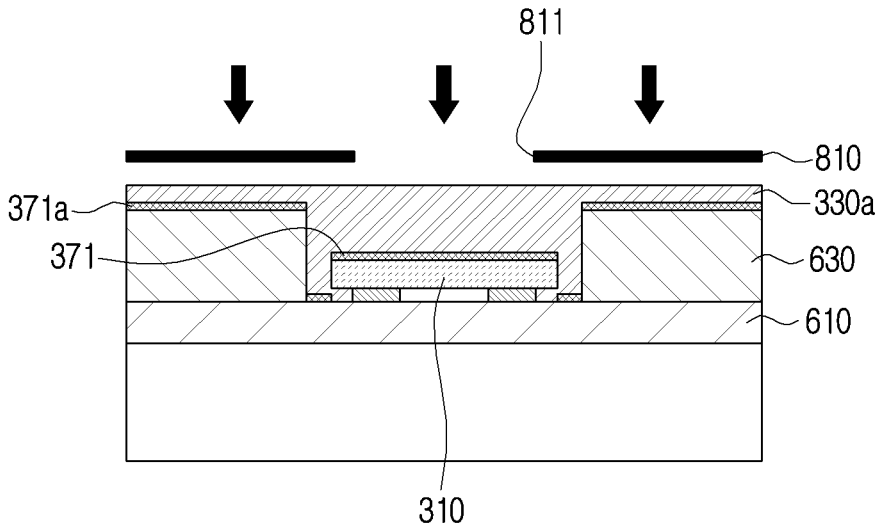

Referring to FIG. 8C, the color conversion material 330a may be deposited so as to cover the first inorganic film 371 and the inorganic thin film 371a to be removed at the process thereafter.

The color conversion material 330a may fill a space in which the light emitting device 310 is disposed between the banks 630, and may be formed to a position higher than the height of the upper portion of the bank 630.

Figure 8D:
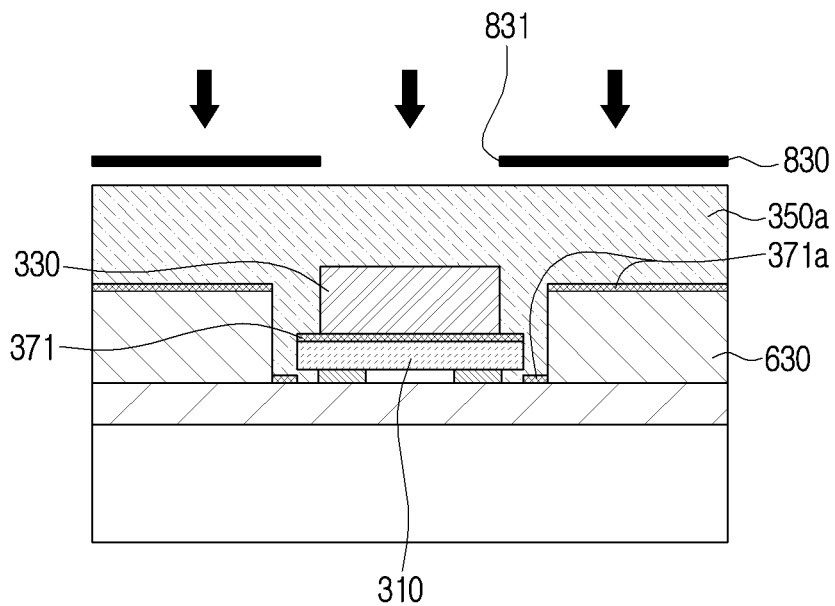

A first mask 810 having a plurality of openings 811 may be disposed at an upper side of the color conversion material 330a to remove the remainder after leaving the color conversion layer (e.g., the color conversion layer 330 of FIG. 8D). The first mask 810 may be aligned such that the opening 811 corresponds to the light emitting device 310.

For example, when the light emitting device 310 is a micro LED of about 50 μm or less, the first mask 810 may use, for example, a fine metal mask (FMM) in consideration of the size of the light emitting device.

The color conversion layer 330 may be formed by removing the remaining color conversion material 330a by leaving a portion of the color conversion material 330a covered on the first inorganic film 371 (703 of FIG. 7).

Referring to FIG. 8D, a color filter material 350a is deposited on the color conversion layer 330, the first inorganic film 371, and the inorganic thin film 371a.

The color filter material 350a may fill a space between the bank 630 and the color conversion layer 330 and may be formed to a position higher than the height of the upper portion of the bank 630.

A second mask 830 having a plurality of openings 831 may be disposed at an upper portion of the color filter material 350a to remove the remainder after leaving the color filter layer (e.g., color filter layer 350 of FIG. 8E) from the entire color filter material 350a. The second mask 830 may be aligned such that the opening 831 corresponds to the light emitting device 310.

Figure 8E:
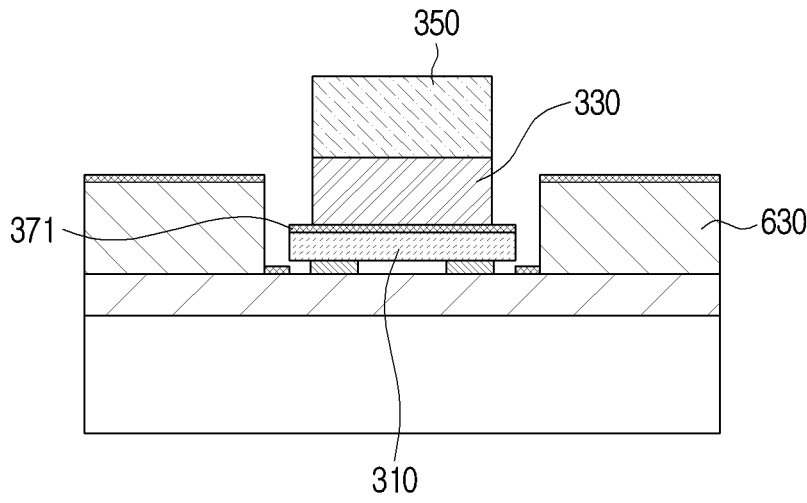

The color filter layer 350 may be formed as shown in FIG. 8E by making a portion of the color filter material 350 covered on the color conversion layer 330 remain and removing remaining color filter material 350a through an exposure process (704 of FIG. 7).

Figure 8F:
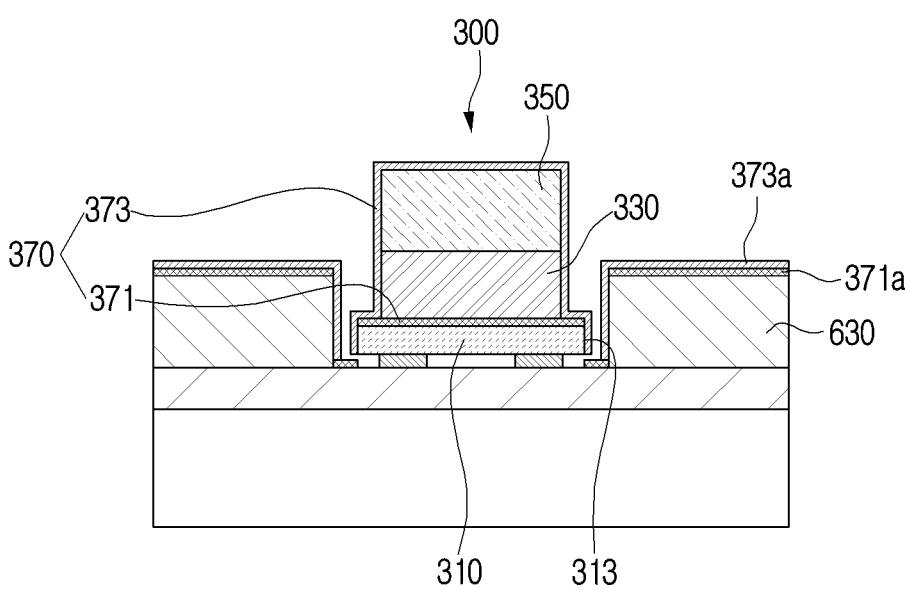

Referring to FIG. 8F, a different inorganic thin film 373a may be deposited on a side surface of the color conversion layer 330, an upper surface and a side surface of the color filter layer 350, a portion of the first inorganic film 371, the side surface 313 of the light emitting device 310, the inorganic thin film 371a formed on an upper portion of the bank 630, and a spaced space between the bank 630 and the light emitting device 310.

In this example, the second inorganic layer 373 may be formed by the different inorganic material film 373a covering a side surface of the color conversion layer 330, an upper surface and a side surface of the color filter layer 350, a portion of the first inorganic film 371, and a side surface 313 of the light emitting device 310 (705 of FIG. 7).

The first inorganic film 371 and the second inorganic film 373 completely surround the color conversion layer 330 to prevent and/or reduce moisture or oxygen from penetrating into the color conversion layer 330. The first inorganic layer 371 and the second inorganic layer 373 may form an encapsulation structure 370 provided in a single subpixel 300.

Figure 8G:
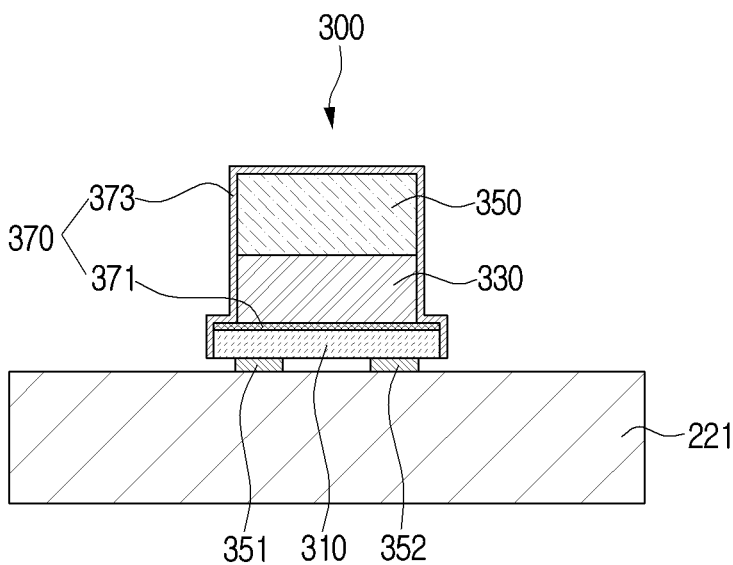

Referring to FIG. 8G, the subpixels 300 having the encapsulation structure 370 on the interposer 600 may be transferred to a predetermined (e.g., specified) pitch on the substrate 221 via a transfer process (706 of FIG. 7).

A plurality of TFTs may be formed on the substrate 221, and each TFT may be electrically connected to control driving of the corresponding subpixels. A pad (not shown) corresponding to a pair of electrodes 351 and 352 provided in the subpixel 300 may be arranged in the substrate 221.

Figure 8H:
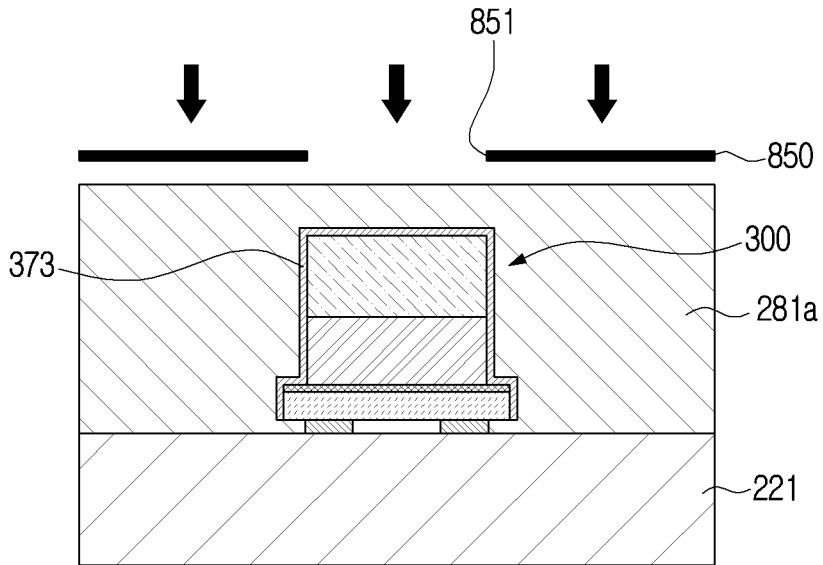

Referring to FIG. 8H, a reflective material 281a is deposited to cover the substrate 221 and the subpixel 300 together. The reflective material 281a may be a material having a high reflectivity capable of refracting and reflecting light.

A third mask 850 may be disposed at an upper portion of the reflective material 281a to remove a corresponding region of the subpixel 300 throughout the reflective material 281a. In the third mask 850, an opening 851 may be aligned such that the opening 851 corresponds to the subpixel 300.

Figure 8I:
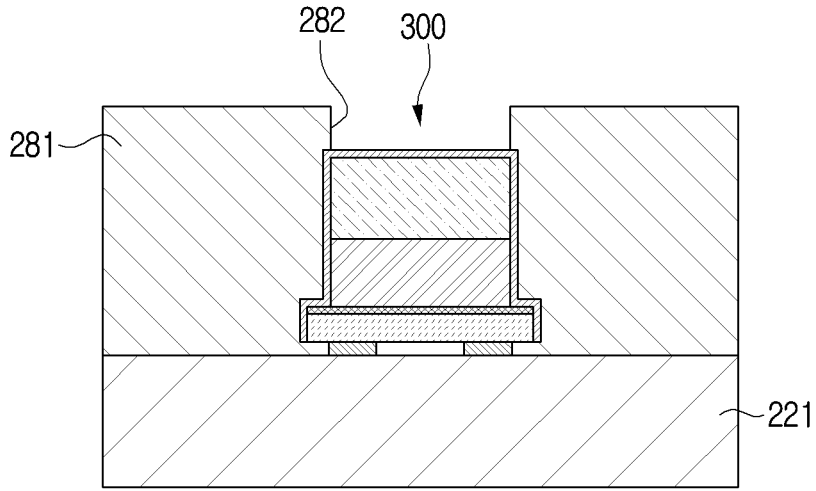

The region corresponding to the subpixel 300 is removed from the entirety of the reflective material 281a through an exposure process. As described above, the reflective material 281a may be patterned to form the reflective layer 281 having an opening 282 exposing an upper portion of the subpixel 300 as shown in FIG. 8I (707 of FIG. 7).

Figure 8J:
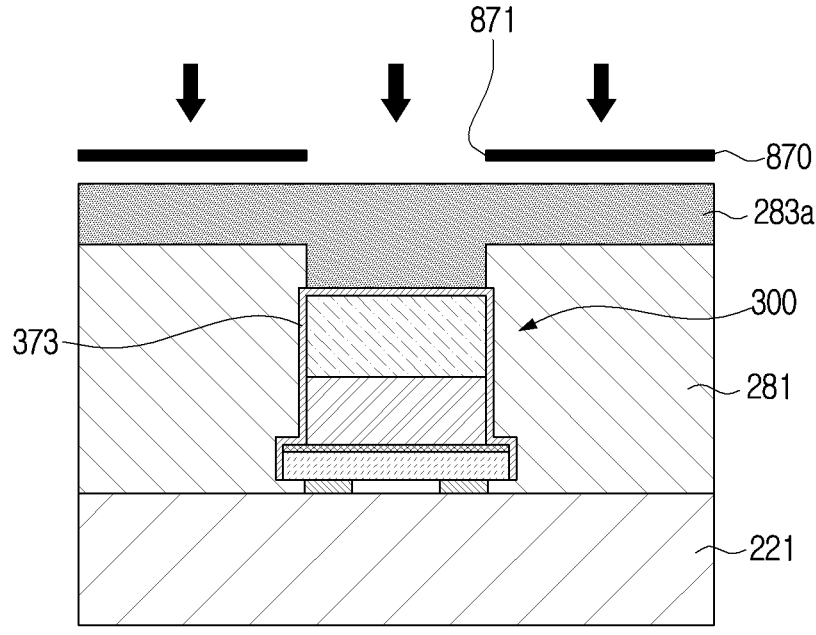

Referring to FIG. 8J, the black matrix material 283a is deposited to cover the upper portion of the reflective layer 281 and the upper portion of the subpixel 300 exposed by the opening 282.

A fourth mask 870 having a plurality of openings 871 may be disposed at an upper portion the black matrix material 283a to remove the corresponding regions of the subpixels 300 throughout the black matrix material 283a. The seventh mask 870 may be aligned such that the opening 871 corresponds to the subpixel 300.

The region corresponding to the subpixel 100 is removed from the black matrix material 283a through the exposure process. As described above, the black matrix material 283a may be patterned to form the black matrix 283 having a cell

Figure 8K:
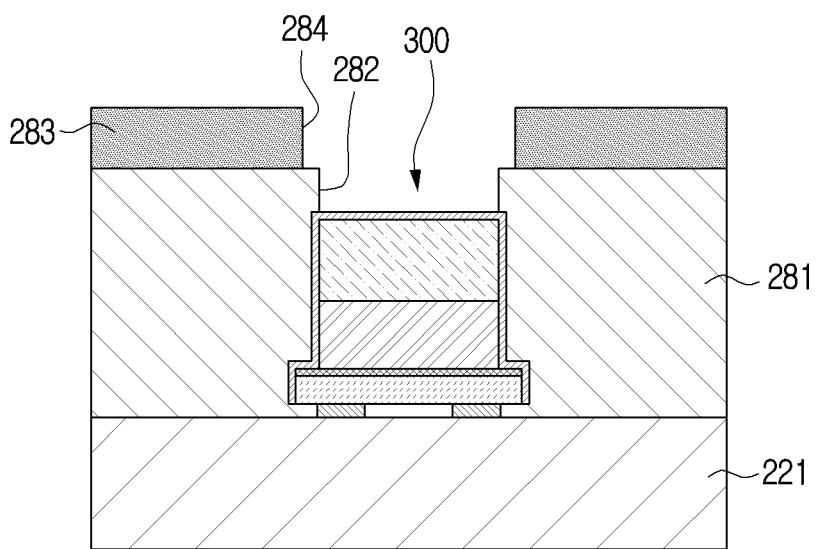

284 exposing an upper portion of the subpixel 300 (upper portion of the second inorganic film 373) as shown in FIG. 8K (708 of FIG. 7).

Figure 8L:
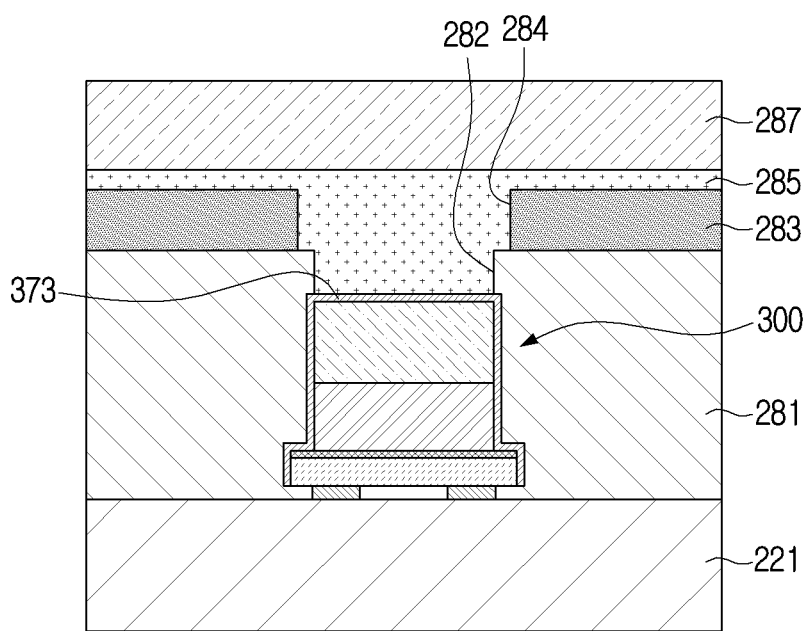

Referring to FIG. 8L, the optical adhesive layer 285 is coated on the black matrix 283 at an upper portion of the black matrix 283 and then the transparent cover 287 is attached (709). The transparent cover 287 may protect the black matrix 283 and the subpixels 300 from an external impact.

Hereinafter, referring to the drawings, the subpixel structure of the display panel according to various example embodiments of this disclosure will be described, and the same reference numerals will be assigned to the same configuration as the subpixel structure (see FIG. 6) of the display panel according to an embodiment as described above.

FIGS. 9, 10, 11, 12, 13, 14, 15, 16, 17, 18, 19, 20A, 20B, 21A, 21B, 22, 23 and 24 are cross-sectional views illustrating example subpixel structures of a display panel according to various embodiments.

Figure 9:
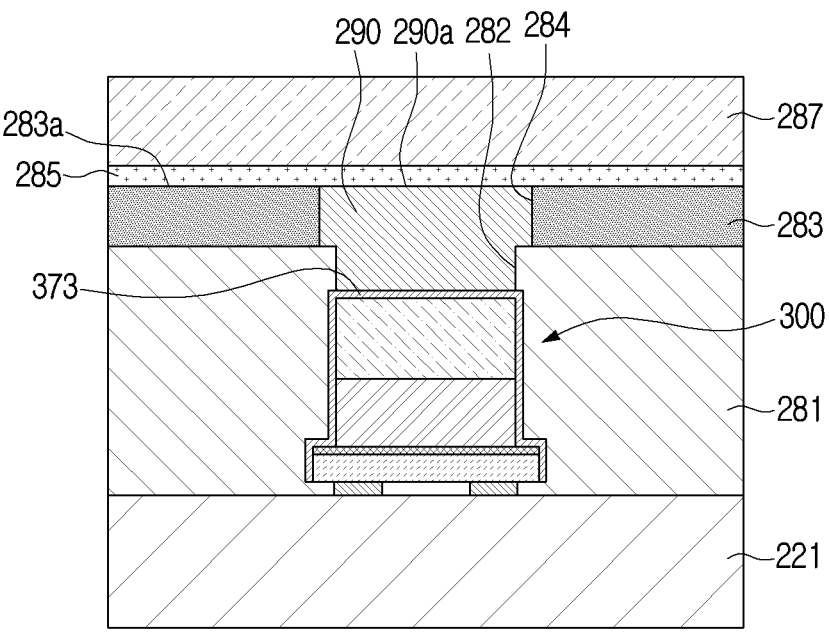
FIGS. 9, 10, 11, 12, 13, 14, 15, 16, 17, 18, 19, 20A, 20B, 21A, 21B, 22, 23 and 24 are cross-sectional views illustrating example subpixel structures of a display panel according to various embodiments.

Referring to FIG. 9, the display panel according to an embodiment may have a structure most similar to the structure of the display panel shown in FIG. 8L, and may further include a transparent resin layer 290 filled in a space provided between the black matrix 283, the reflective layer 281, and a portion of the encapsulation structure (e.g., the second inorganic film 373). An upper surface 290a of the transparent resin layer 290 may be located at a height approximately equal to the upper surface 283a of the black matrix 283. In this example, the optical adhesive layer 285 may be disposed between the transparent cover 287, the black matrix 283, and the transparent resin layer 290. For example, light diffusing agent (e.g., light diffusing agent 910 of FIG. 17) may be uniformly distributed in the transparent resin layer 290 in order to improve the light efficiency of the subpixel 300.

Figure 10:
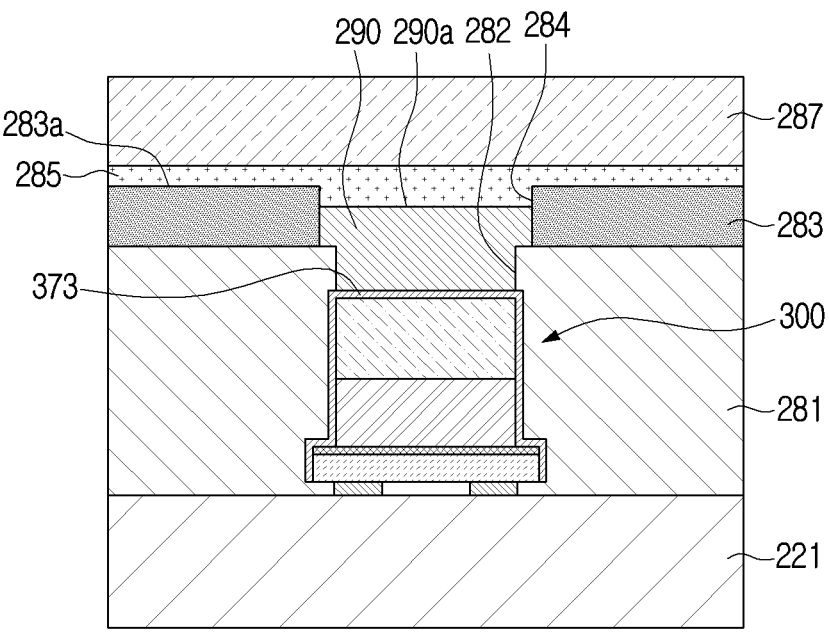

Referring to FIG. 10, a display panel according to an embodiment may include the transparent resin layer 290 as shown in FIG. 9. In this example, the transparent resin layer 290 may be located at a height different from the upper surface 283a of the black matrix 283. For example, the upper surface 290a of the transparent resin layer 290 may be at a lower position than the top surface 283a of the black matrix 283. Accordingly, a space may be provided between the black matrix 283 and the transparent resin layer 290. The optical adhesive layer 285 disposed between the black matrix 283 and the transparent cover 287 may fill a space provided between the black matrix 283 and the transparent resin layer 290. According to an embodiment, the light diffusing agent (e.g., light diffusing agent 910 of FIG. 17) may be uniformly distributed in order to improve the light efficiency of the subpixel 300.

Figure 11:
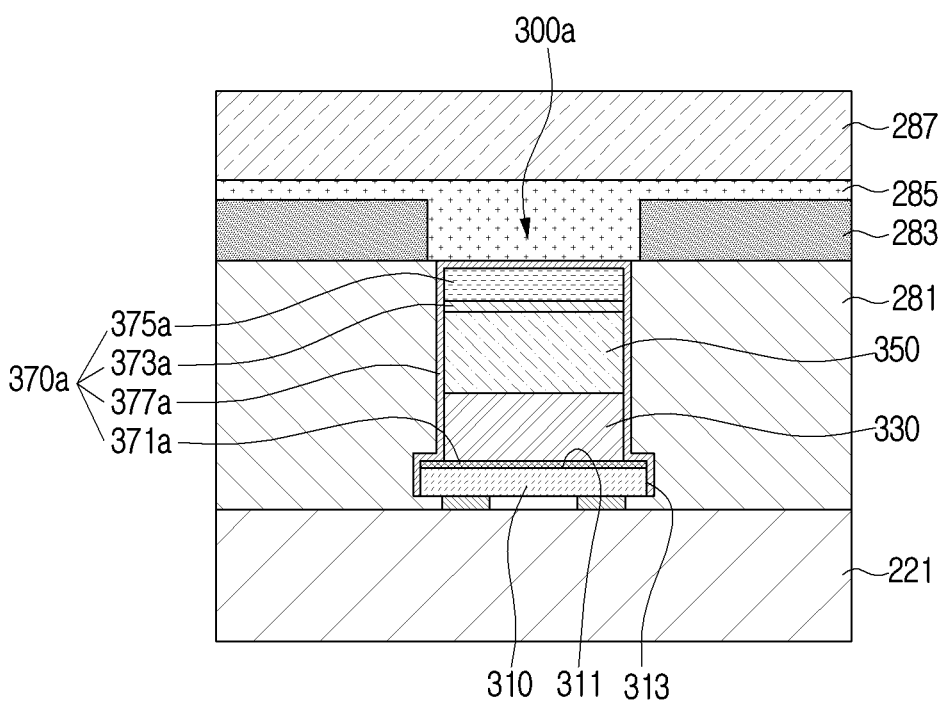

Referring to FIG. 11, a subpixel 300a according to an embodiment may include the encapsulation structure 370a capable of protecting the color conversion layer 330 from pressure applied during a thermal compression process to be described in greater detail below.

The display panel of the disclosure may perform a thermal compression process of transferring a plurality of subpixels from the interposer 600 to the substrate 221, and then connecting the electrodes of the subpixels to the pad of the substrate 221.

The thermal compression process is a process for bonding a plurality of subpixels transferred to the substrate 221 to a substrate, and simultaneously presses the upper portions of the plurality of subpixels at a predetermined pressure using a pressing plate (not shown).

In this example, a portion of the encapsulation structure (e.g., an inorganic film surrounding the upper portion of the subpixel) may be damaged by the pressure applied to the plurality of subpixels. In consideration of this, the subpixel 300a may include a multi-layered encapsulation structure 370a.

According to an embodiment, the subpixel 300a may include the encapsulation structure 370a including a first inorganic film 371a, a second inorganic film 373a, an organic film 375a, and a third inorganic film 377a.

According to an embodiment, the first inorganic layer 371a may cover the entire portion of the light emitting surface 311 of the light emitting device 310. The first inorganic film 371a may surround the lower surface of the color conversion layer 330.

According to an embodiment, the first inorganic film 371a may cover the entire light emitting surface 311 of the light emitting device 310 and at least a portion of the side surface 313 of the light emitting device 310. According to an embodiment, a multi-layered structure in which at least one organic film and at least one inorganic film are alternately stacked may be provided on the upper portion of the first inorganic film 371a.

According to an embodiment, the second inorganic film 373a may be formed to cover the upper surface of the color filter layer 350. The second inorganic film 373a may serve as a secondary blocking member that blocks moisture and oxygen from penetrating into the color conversion layer 330 even if the third inorganic film 377a is damaged in the thermal compression process.

According to an embodiment, the organic film 375a may be formed to cover the upper surface of the second inorganic film 373a. The organic film 375a may have a strength greater than that of the inorganic film, and may withstand the pressure applied to the upper portion of the subpixel 300a in a thermal compression process. Therefore, the organic film 375a may prevent and/or reduce the second inorganic film 373a from being damaged by the pressure.

According to an embodiment, a third inorganic film 377a may cover an upper portion and a side portion of the organic film 375a, a side portion of the second inorganic film 373a, a side portion of the color filter layer 350, a side portion of the color conversion layer 330, a portion (periphery) of the first inorganic film 371, and a side portion 313 of the light emitting device 310.

According to an embodiment, a multi-layered structure in which at least one organic film and at least one inorganic film are alternately stacked at an upper portion of the third inorganic film 377a may be provided.

According to an embodiment, the encapsulation structure 370a may be formed in an order of the first inorganic film 371a, the second inorganic film 373a, the organic film 375a, and the third inorganic film 377a.

Figure 12:
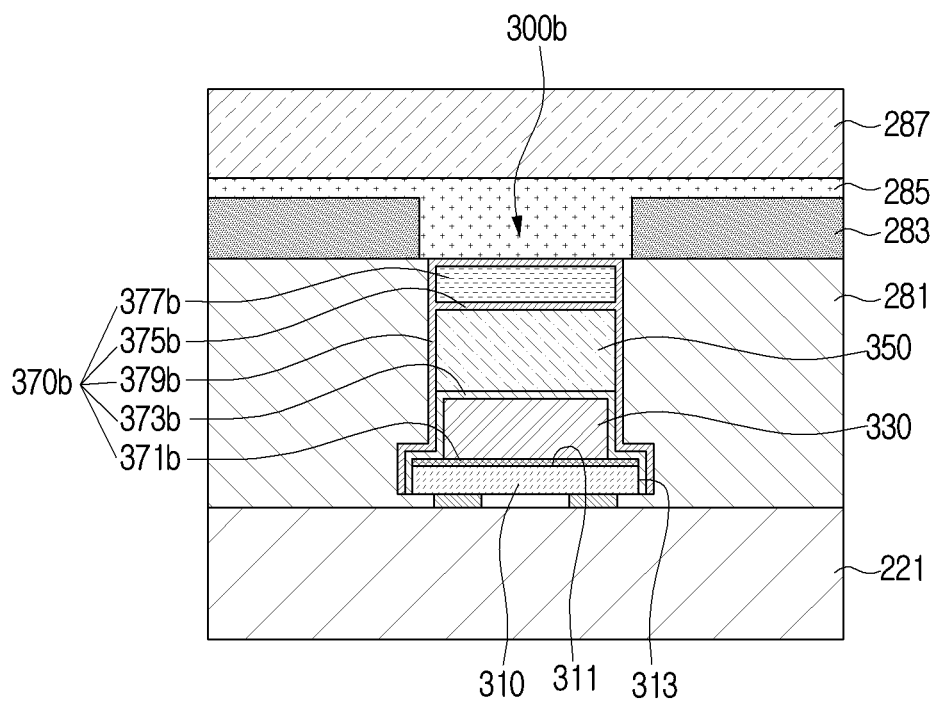

Referring to FIG. 12, the subpixel 300b according to an embodiment may include the encapsulation structure 370b which further includes the one-layer inorganic film than the subpixel 300a described above.

According to an embodiment, the encapsulation structure 370b may include four-step inorganic films 371b, 373b, 375b, 379b and one-layer organic film 377b.

According to an embodiment, the first inorganic film 371b may cover the entire light emitting surface 311 of the light emitting device 310. The first inorganic film 371b may surround the lower surface of the color conversion layer 330.

According to an embodiment, the first inorganic film 371b may cover the entirety of the light emitting surface 311 of the light emitting device 310 and at least a portion of the side surface 313 of the light emitting device. According to an embodiment, a multi-layered structure in which at least one organic film and at least one inorganic film are alternately stacked may be provided in an upper portion of the first inorganic film 371*b*.

According to an embodiment, the second inorganic film 373*b* may cover the upper surface and side of the color conversion layer 330, a portion (periphery) of the first inorganic film 371*a* and the side 313 of the light emitting device 310. The second inorganic film 373*b* may function as a tertiary blocking member that blocks moisture and oxygen from penetrating into the color conversion layer 330 even if the third inorganic film 375*b* and the fourth inorganic film 379*b* are damaged in the heat pressing process.

According to an embodiment, in the upper portion of the second inorganic film 373*b*, a multi-layered structure in which at least one organic film and at least one inorganic film are alternately stacked.

According to an embodiment, the encapsulation structure 370*b* may directly cover the upper surface and side of the color conversion layer 330 through the second inorganic film 373*b*, unlike the above-mentioned encapsulation structures 370, 370*a*. Accordingly, the color conversion layer 330 may be protected from moisture and oxygen by the first and second inorganic films 371*b*, 373*b*.

According to an embodiment, the third inorganic film 375*b* may be formed to cover the upper surface of the color filter layer 350. The third inorganic film 375*b* may function as a secondary blocking member that blocks moisture and oxygen from penetrating into the color conversion layer 330 even if the fourth inorganic film 379*b* is damaged in the heat pressing process.

According to an embodiment, the organic film 377*b* may be formed to cover the upper surface of the third inorganic film 375*b*. The organic film 377*b* may have a greater strength than the inorganic film and may withstand the pressure exerted on the upper portion of the subpixel 300*b* in the heat pressing process. Thus, the organic film 377*b* may prevent and/or reduce the third inorganic film 375*b* from being damaged by the pressure.

According to an embodiment, the fourth inorganic film 379*b* may cover the upper surface and side of the organic film 377*b*, the lateral portion of the third inorganic film 375*b*, the side of the color filter layer 350, the side of the second inorganic film 373*b*.

According to an embodiment, the fourth inorganic film 379*b* may form a double protection film with the second inorganic film 373*b* on the side of the color conversion layer 330 as it is arranged to cover the side of the second inorganic film 373*b*.

According to an embodiment, in the upper portion of the fourth inorganic film 379*b*, a multi-layered structure in which at least one organic film and at least one inorganic film are stacked alternately.

According to an embodiment, the encapsulation structure 370*b* may be formed in an order of the first inorganic film 371*b*, the second inorganic film 373*b*, the third inorganic film 375*b*, the organic film 377*b*, and the fourth inorganic film 379*b*.

Although not shown in the drawing, the encapsulation structure 370*b* of this disclosure may be formed by laminating the inorganic film by three or more layers so as to effectively block moisture and oxygen from penetrating into the color conversion layer.

Figure 13:
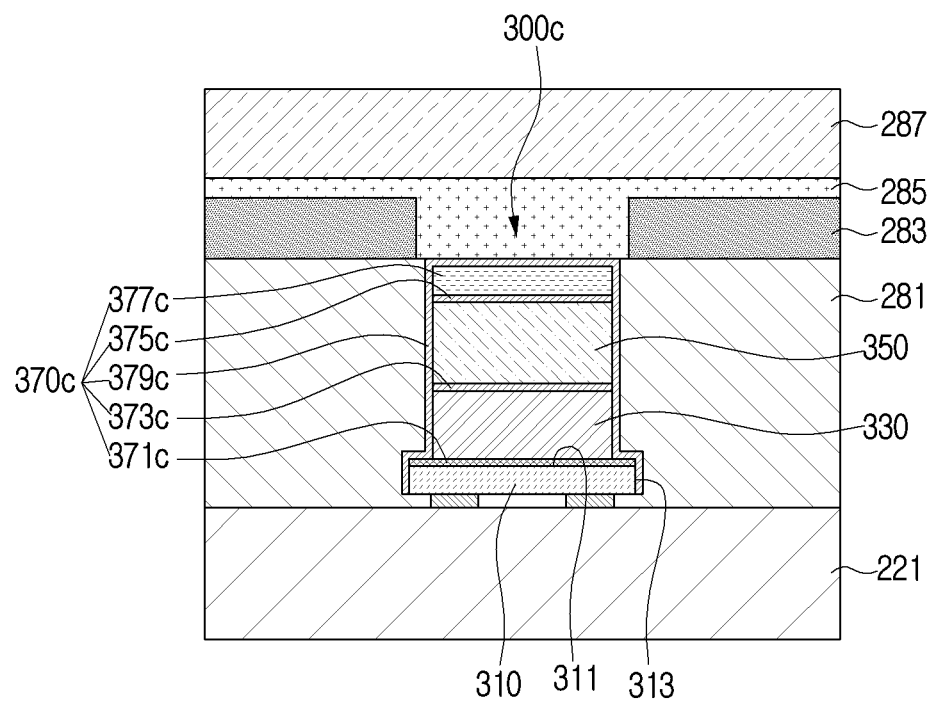

Referring to FIG. 13, the encapsulation structure 370*c* provided in the subpixel 300*c* may include four-step inorganic films 371*c*, 373*c*, 375*c*, 379*c*, and one-layer organic film 377*c*.

According to an embodiment, the first inorganic film 371*c* may cover the entirety of the light emitting surface 311 of the light emitting device 300. The first inorganic film 371*c* may surround the lower surface of the color conversion layer 330.

According to an embodiment, the first inorganic film 371*c* may cover the entirety of the light emitting surface 311 of the light emitting device 310 and at least a portion of the side 313 of the light emitting device 310. According to an embodiment, the upper portion of the first inorganic film 371*c* may be provided with a multi-layered structure in which at least one organic film and at least one inorganic film are alternately stacked.

According to an embodiment, the second inorganic film 373*c* may cover only the upper surface of the color conversion layer 330, unlike the above-mentioned second inorganic film 373*b* (FIG. 12). The second inorganic film 373*c* may function as a tertiary blocking member that blocks moisture and oxygen from penetrating into the color conversion layer 330 even if the third inorganic film 375*c* and the fourth inorganic film 379*c* are damaged in the heat pressing process.

According to an embodiment, the upper portion of the second inorganic film 373*c* may be provided with a multi-layered structure in which at least one organic film and at least one inorganic film are alternately stacked.

According to an embodiment, the third inorganic film 375*c* may be formed to cover the upper surface of the color filter layer 350. The third inorganic film 375*c* may serve as a secondary blocking member that blocks moisture and oxygen from penetrating into the color conversion layer 330 even if the fourth inorganic film 379*c* is damaged in the thermal compression process.

According to an embodiment, the organic film 377*c* may be formed to cover the upper surface of the third inorganic film 375*c*. The organic thin film 377*c* may have a greater strength than the inorganic film and may withstand pressure applied to the upper portion of the subpixel 300*c* in a thermal compression process. Therefore, the organic film 377*c* may prevent and/or reduce the third inorganic film 375*c* from being damaged by the pressure.

According to an embodiment, the fourth inorganic film 379*c* may cover an upper surface and a side end of the organic film 377*c*, a side end of the third inorganic film 375*c*, a side of the color filter layer 350, a side end of the second inorganic film 373*c*, a side of the color conversion layer 330, a portion (periphery) of the first inorganic film 371*c*, and the side surface 313 of the light emitting device 310.

According to an embodiment, a multi-layered structure in which at least one organic film and at least one inorganic film are alternately stacked on the upper portion of the fourth inorganic film 379*c* may be provided. According to an embodiment, the encapsulation structure 370*c* may be formed in the order of the first inorganic film 371*c*, the second inorganic film 373*c*, the third inorganic film 375*c*, the organic film 377*c*, and the fourth inorganic film 379*c*.

Figure 14:
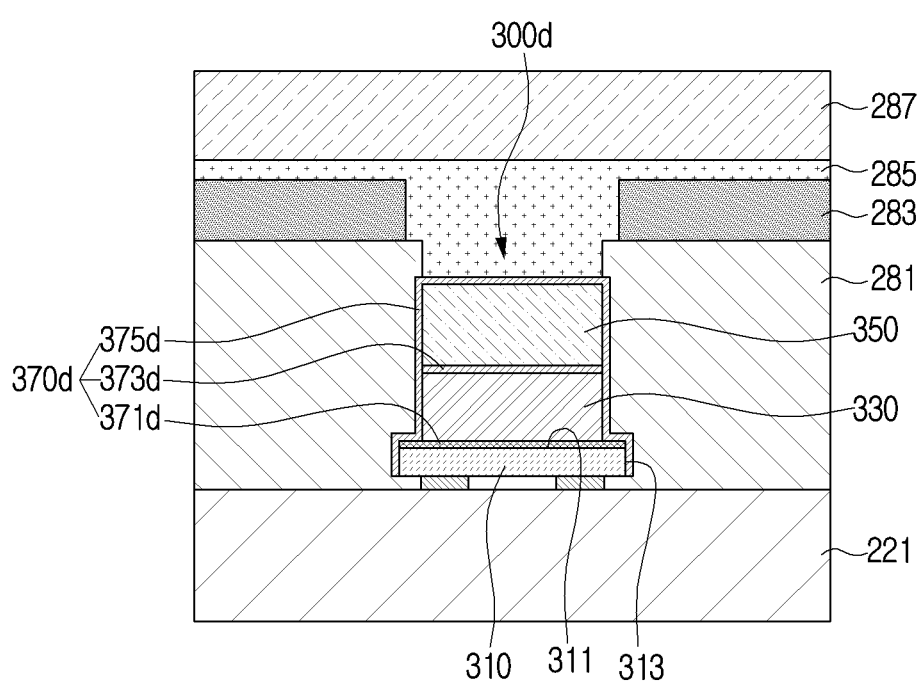

Referring to FIG. 14, the encapsulation structure 370*d* of the subpixel 300*d* may include the first inorganic film 371*d*, the second inorganic film 373*d*, and the third inorganic film 375*d*.

According to an embodiment, the first inorganic film 371*d* may cover the entire light emitting surface 311 of the light emitting device 310. The first inorganic film 371*d* may surround the lower surface of the color conversion layer 330.

According to an embodiment, the first inorganic film 371*d* may cover the entire light emitting surface 311 of the light emitting device 310 and at least part of the side 313 of the light emitting device. According to an embodiment, the upper portion of the first inorganic film 371*d* may be provided with a multi-layered structure in which at least one organic film and at least one inorganic film are alternately stacked.

According to an embodiment, the second inorganic film 373*d* may cover the upper surface of the color conversion layer 330. The second inorganic film 373*d* may function as a secondary blocking member that blocks moisture and oxygen from penetrating into the color conversion layer 330 even if the third inorganic film 375*d* is damaged.

According to an embodiment, the upper portion of the second inorganic film 373*d* may be provided with a multi-layered structure in which at least one organic film and at least one inorganic film are alternately stacked.

According to an embodiment, the third inorganic film 375*d* may cover the upper surface and side of the color filter layer 350, the side end of the second inorganic film 373*d*, the side of the color conversion layer 330, a portion (periphery) of the first inorganic film 371*d* and the side 313 of the light emitting device 310.

The third inorganic film 375*d* directly covers the side of the color conversion layer 330 and covers the upper surface and side of the color filter layer 350 together, so that the upper surface and side of the color conversion layer 330 may prevent and/or reduce moisture and oxygen contained in the air from penetrating.

According to an embodiment, the upper portion of the third inorganic film 375*d* may be provided with a multi-layered structure in which at least one organic film and at least one inorganic film are alternately stacked.

According to an embodiment, the encapsulation structure 370*d* may be formed in the order of the first inorganic film 371*d*, the second inorganic film 373*d*, and the third inorganic film 375*d*.

According to an embodiment, since the color filter layer 350 is strong to moisture and oxygen than the color conversion layer 330, only a portion of the color filter layer 350 may be covered or not covered by the encapsulation structure. Hereinafter, an encapsulation structure will be described in greater detail below with reference to FIGS. 15 and 16.

Figure 15:
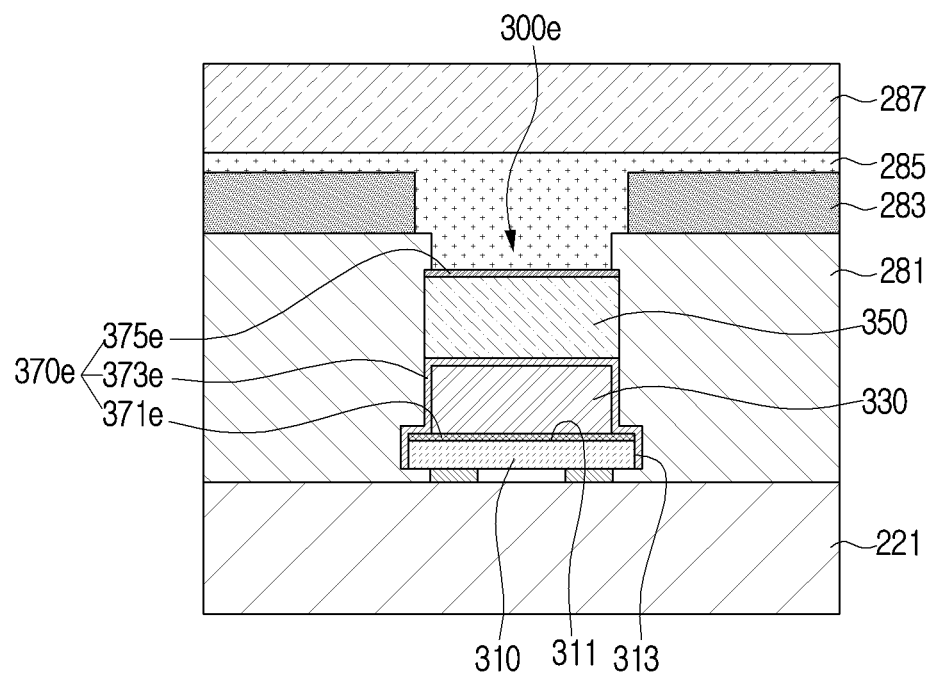

Referring to FIG. 15, the encapsulation structure 370*e* of the subpixel 300*e* may include the first inorganic film 371*e*, second inorganic film 373*e*, and third inorganic film 375*e*.

According to an embodiment, the first inorganic film 371*e* may cover entire light emitting surface 311 of the light emitting device 310. The first inorganic film 371*e* may surround the lower surface of the color conversion layer 330.

According to an embodiment, the first inorganic film 371*e* may cover the entire light emitting surface 311 of the light emitting device 310 and at least a part of the side surface 313 of the light emitting device. According to an embodiment, a multi-layer structure in which at least one organic film and at least one inorganic film are alternately stacked on the first inorganic film 371*e* may be provided on the upper portion of the first inorganic film 371*e*.

According to an embodiment, the second inorganic film 373*e* may cover an upper surface and a side surface of the color conversion layer 330, a portion (periphery) of the first inorganic film 371*e*, and a side surface 313 of the light emitting device 310. The upper surface, the side, and lower surface of the color conversion layer 330 may be completely surrounded by the first and second inorganic films 371*e* and 373*e*.

According to an embodiment, the second inorganic film 373*e* may serve as a secondary blocking member that blocks moisture and oxygen from penetrating into the color conversion layer 330 even if the third inorganic film 375*e* is damaged.

According to an embodiment, at an upper portion of the second inorganic film 373*e*, a multi-layered structure in which at least one organic film and at least one inorganic film may be alternately stacked may be provided.

According to an embodiment, the third inorganic film 375*e* may be formed to cover the upper surface of the color filter layer 350.

According to an embodiment, at an upper portion of the third inorganic film 375*e*, a multi-layered structure in which at least one organic film and at least one inorganic film are alternately stacked may be provided.

The encapsulation structure 370*e* may completely surround the color conversion layer 330 or may surround a portion of the color filter layer 350.

According to an embodiment, the encapsulation structure 370*e* may be formed in the order of the first inorganic film 371*e*, the second inorganic film 373*e*, and the third inorganic film 375*e*.

Figure 16:
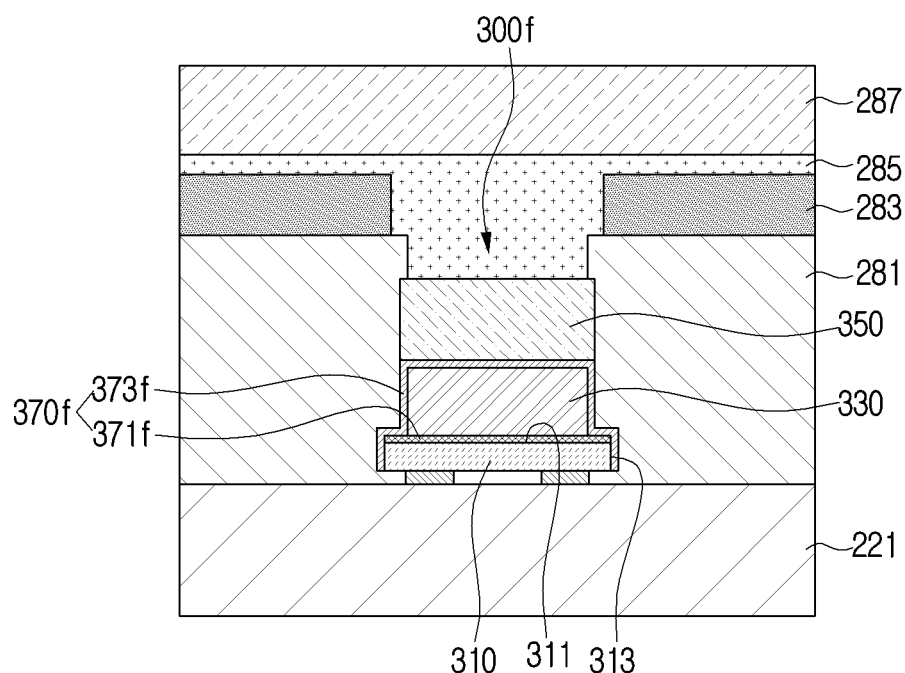

Referring to FIG. 16, the encapsulation structure 370*f* of the subpixel 300*f* may include a first inorganic film 371*f* and a second inorganic film 373*f*.

According to an embodiment, the first inorganic film 371*f* may cover the entire light emitting surface 311 of the light emitting device 310. The first inorganic film 371*f* may surround the lower surface of the color conversion layer 330.

According to an embodiment, the first inorganic film 371*f* may cover the entire light emitting surface 311 of the light emitting device 310 and at least a portion of the side surface 313 of the light emitting device 310. According to an embodiment, a multi-layered structure in which at least one organic film and at least one inorganic film are alternately stacked may be provided on the upper portion of the first inorganic film 371*f*.

According to an embodiment, the second inorganic film 373*f* may cover an upper surface and a side surface of the color conversion layer 330, a portion (periphery) of the first inorganic film 371*f*, and a side surface 313 of the light emitting device 310. The upper surface, side surface, and lower surface of the color conversion layer 330 may be completely surrounded by the first and second inorganic films 371*f* and 373*f*.

According to an embodiment, a multi-layered structure in which at least one organic film and at least one inorganic film are alternately stacked on the upper portion of the second inorganic film 373*f* may be provided.

The encapsulation structure 370*f* may be formed to completely surround the color conversion layer 330 but not to surround the color filter layer 350.

According to an embodiment, the encapsulation structure 370*f* may be formed in an order of the first inorganic film 371*f* and the second inorganic film 373*f*.

The display panel 210 according to an embodiment of the disclosure may include a light diffusing agent in at least one of configurations disposed between the light emitting device 310 and the transparent cover 287.

Figure 17:
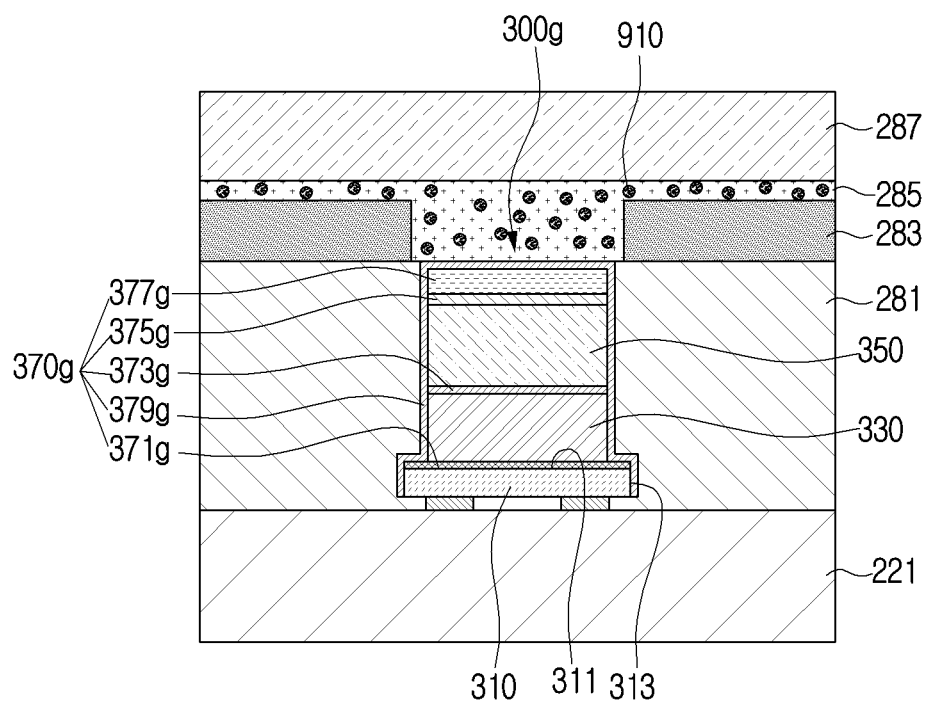

Referring to FIG. 17, the encapsulation structure 370*g* of the subpixel 300*g* may be the same as or similar to the encapsulation structure 370*c* of the subpixel 300*c* described above (FIG. 13). The encapsulation structure 370*g* may include a first inorganic film 371*g*, a second inorganic film 373*g*, a third inorganic film 375*g*, an organic film 377*g*, and a fourth inorganic film 379*g*.

According to an embodiment, the first inorganic film 371*g* may cover the entire light emitting surface 311 of the light emitting device 310 and at least a portion of the side surface 313 of the light emitting device. According to an embodiment, a multi-layered structure in which at least one organic film and at least one inorganic film are alternately stacked may be provided on the upper surface of the first inorganic film 371*g*.

According to an embodiment, a multi-layered structure in which at least one organic film and at least one inorganic film are alternately stacked on the upper surface of the second inorganic film 373*g* may be provided.

According to an embodiment, a multi-layered structure in which at least one organic film and at least one inorganic film are alternately stacked in an upper portion of the third inorganic film 375*g* may be provided.

According to an embodiment, a multi-layered structure in which at least one organic film and at least one inorganic film are alternately stacked on the upper portion of the fourth inorganic film 379*g* may be provided.

According to an embodiment, an optical adhesive layer 285 provided on the display panel 210 may include a light diffusing agent 910. The light diffusing agent 910 may be an organic light diffusing agent, an inorganic light diffusing agent, or a mixture thereof. The light diffusing agent 910 may be, for example, and without limitation, $TiO_2$, $SiO_2$, a glass bead, or may be uniformly distributed in the optical adhesive layer 285 in the form of a particle as shown in FIG. 17.

According to an embodiment, the light emitted from the subpixel 300*g* and incident on the optical adhesive layer 285 may be scattered and diffused in the optical adhesive layer 285 by the light diffusing agent 910. Accordingly, the subpixel 300*g* of the disclosure may improve luminance.

Although not shown in the drawing, according to various embodiments, when the light diffusing agent 910 is not included in the optical adhesive layer 285, the light diffusing agent 910 may be included in one of the organic film 375*g*, the color filter layer 350, and the color conversion layer 330.

For example, the light diffusing agent 910 may be uniformly dispersed throughout the color conversion layer 330. In this example, the light diffusing agent 910 increases the light conversion efficiency by the light incident on the color conversion layer 330 and enables uniform wavelength conversion. The light diffusing agent 910 may improve the luminance of the subpixel to which the color conversion layer 330 is applied.

According to an embodiment, the light diffusing agent 910 may be included in at least two of the optical adhesive layer 285, the organic film 375*g*, the color filter layer 350, and the color conversion layer 330.

Figure 18:
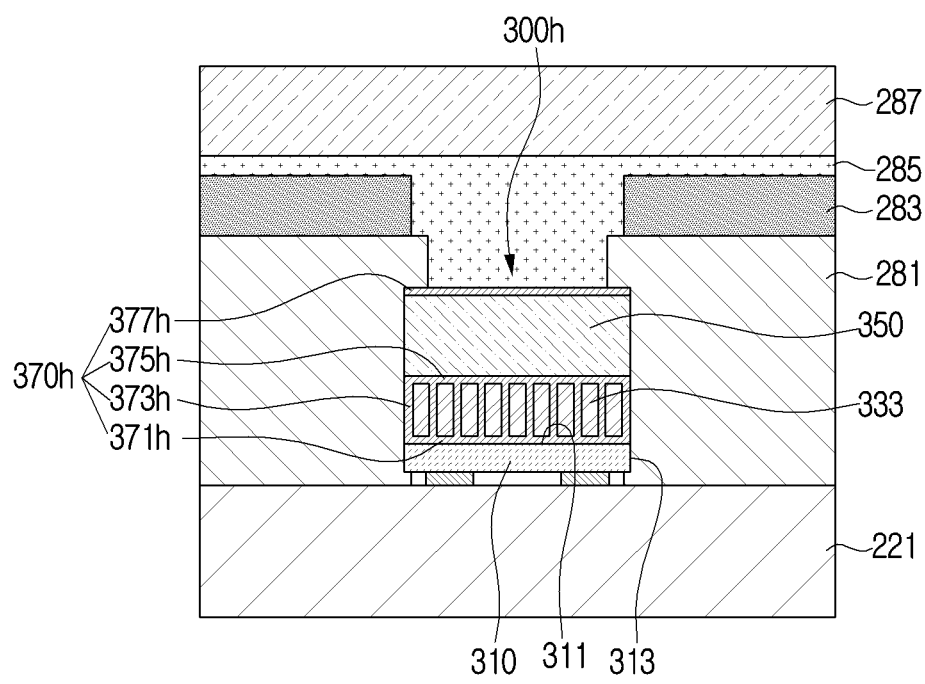
Figure 19:
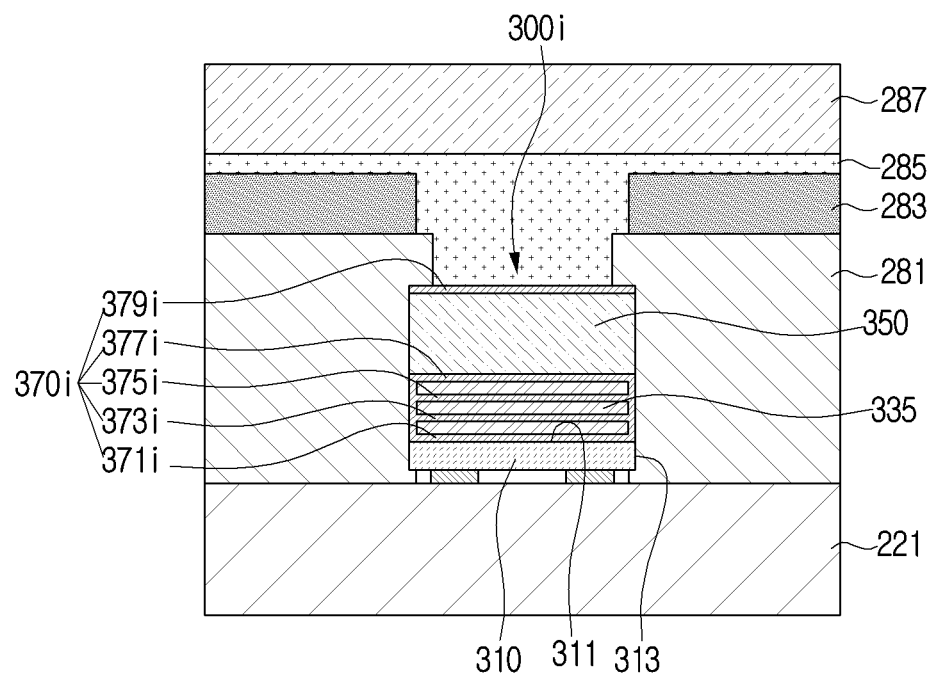

Referring to FIG. 18, the encapsulation structure 370*h* of the subpixel 300*h* may include first to fourth inorganic films 371*h*, 373*h*, 375*h*, 377*h*.

According to an embodiment, the first inorganic film 371*h* may cover the entire light emitting surface 311 of the light emitting device 310. The first inorganic film 371*h* may surround the lower surface of the color conversion layer 333.

According to an embodiment, the first inorganic film 371*h* may cover the entire light emitting surface 311 of the light emitting device 310 and at least a portion of the side surface 313 of the light emitting device 310.

According to an embodiment, the second inorganic film 373*h* may be formed substantially perpendicular to the first inorganic film 371*h* with a predetermined distance. The spaces partitioned by the plurality of second inorganic films 373*h* may be filled with a color conversion material. Accordingly, the color conversion layer 333 may be arranged at regular intervals along the light emitting surface 311 of the light emitting device 310.

According to an embodiment, the first inorganic film 371*h* and the second inorganic film 373*h* may be formed through a single process. For example, after forming an inorganic film of a predetermined thickness (e.g., a length from the light emitting surface to the upper end of the second inorganic film 373*h*) on the light emitting surface of the light emitting device 310, spaces filled with the color conversion material may be formed from the upper portion to the lower portion of the inorganic film (e.g., the second inorganic film 373*h*) by a predetermined (e.g., specified) depth through the etching process. Accordingly, the first inorganic film 371*h* and the second inorganic film 373*h* may be formed simultaneously by a single process. However, the first inorganic film 371*h* and the second inorganic film 373*h* may be formed through separate processes, respectively.

When a plurality of color conversion layers 333 are formed as described above, a portion of the encapsulation structure may be damaged by an external impact, so that the remaining color conversion layer may be used even if the color conversion layer 333 is not used as moisture or oxygen penetrates into a part of the color conversion layer, and thus the reliability of the product may be secured.

According to an embodiment, the third inorganic film 375*h* may form each color conversion layer 333 at spaces partitioned by a plurality of second inorganic films 373*h* and cover the upper portion of the second inorganic film 373*h* and the upper portion of the color conversion layer 333 together.

According to an embodiment, the upper portion of the third inorganic film 375*h* may be provided with a multi-layered structure in which at least one organic film and at least one inorganic film are alternately stacked. According to an embodiment, the fourth inorganic film 377*h* may be formed to cover the upper surface of the color filter layer 350.

When the fourth inorganic film 377*h* is damaged by an external impact, moisture and oxygen penetrating into the color conversion layer 333 may be blocked by the third inorganic film 375*h*.

According to an embodiment, the upper portion of the fourth inorganic film 377*h* may be provided with a multi-layered structure in which at least one organic film and at least one inorganic film are alternately stacked.

Referring to 19, the encapsulation structure 377*i* of the subpixel 300*i* may have a structure divided into multiple spaces so as to place a plurality of color conversion layers 335, similar to the above-mentioned encapsulation structure 370*h* (FIG. 18).

According to an embodiment, the encapsulation structure 370*i* may include first to fifth inorganic films 371*i*, 373*i*, 375*i*, 377*i*, 379*i*.

According to an embodiment, the first inorganic film 371*i* may cover entire light emitting surface 311 of the light emitting device 310. The first inorganic film 371*i* may surround the lower surface of the color conversion layer 335.

According to an embodiment, the first inorganic film 371*i* may cover the entire light emitting surface 311 of the light emitting device 310 and at least one of the side 313 of the light emitting device 310. According to an embodiment, the upper portion of the first inorganic film 371*i* may be provided with a multi-layered structure in which at least one organic film and at least one inorganic film are alternately stacked.

According to an embodiment, a plurality of color conversion layers 335 may be stacked on the first inorganic film 371i with an interval. In this example, the second inorganic film 373i and the third inorganic film 375i may be disposed between the vertically disposed color conversion layers 335.

According to an embodiment, at an upper portion of the second inorganic film 373i and an upper portion of the third inorganic film 375i, a multi-layered structure in which at least one organic film and at least one inorganic film may be alternately stacked may be provided.

According to an embodiment, the fourth inorganic film 377i may extend to the upper surface of the color conversion layer 335 on the upper side and the side end of the first inorganic film 371i for covering. Accordingly, the color conversion layers 335 may be stacked in a state of being apart from each other in a substantially vertical direction.

When the color conversion layers 335 are partitioned to be independent, a portion of the encapsulation structure may be damaged by an external impact, and if moisture or oxygen penetrates into a part of the color conversion layer among a plurality of color conversion layers 335 and the color conversion layer may not function well, remaining color conversion layers may be usable.

According to an embodiment, the upper portion of the fourth inorganic film 377i may be provided with a multi-layered structure in which at least one organic film and at least one inorganic film are alternately stacked.

According to an embodiment, the fifth inorganic film 379i may be formed to cover the upper surface of the color filter layer 350. When the fifth inorganic film 379i is damaged by an external impact, moisture and oxygen penetrating into the color conversion layer 335 may be blocked by the fourth inorganic film 377i.

According to an embodiment, the upper portion of the fifth inorganic film 379i may be provided with a multi-layered structure in which at least one organic film and at least one inorganic film are alternately stacked.

The above-mentioned display panels form a reflective layer on the substrate after the subpixel is transferred into the substrate. Accordingly, the reflector layer may be placed to surround the subpixel in close contact with the side of the subpixel.

Hereinafter, a structure of a display panel on which subpixel is transferred in a state where a reflective layer is formed on the substrate will be described in greater detail below with reference to FIGS. 20A, 20B, 21A and 21B.

Figure 20A:
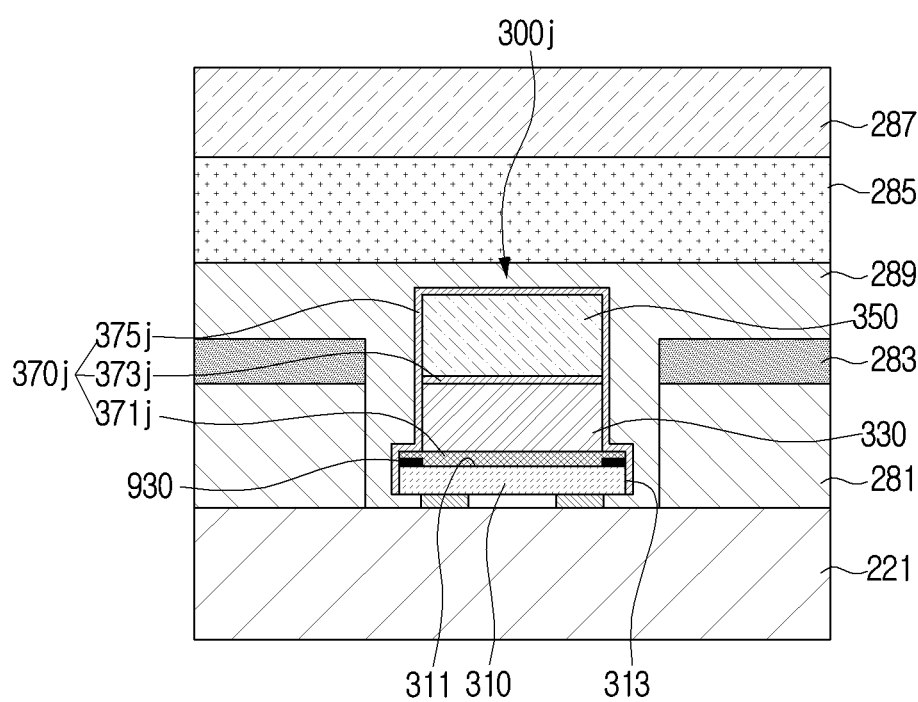

Referring to FIG. 20A, the subpixel 300j may be transferred to a space located between the adjacent reflective layer 281 in the state in which the reflective layer 281 is already formed on the substrate 221.

According to an embodiment, the subpixel 300j transferred to the substrate 221 may be bonded to the substrate through a thermal compression process. In this example, when the pressurized plate pressurizes the upper portion of the subpixel 300j, the height of the reflective layer 281 may be formed to be low so as not to be interfered with by the black matrix 283, and the upper end of the black matrix 283 is disposed lower than the upper end of the subpixel 300j. The display panel may provide a favorable structure for the process of transferring the subpixel 300j with encapsulation structure 370j to the substrate 221 and the process of thermal compression.

According to an embodiment, the space formed between the subpixel 300j and the reflective layer 281 and between the subpixel 300j and the black matrix 283 may be filled with a planarization layer 289. The planarization layer 289 may cover the upper portion of the black matrix 283 and the subpixel 300j together so that the transparent cover 287 may be placed on the upper surface of the subpixel 300j.

According to an embodiment, the planarization layer 289 may be formed of a same reflective material as the reflective layer 281.

According to an embodiment, the planarization layer 289 may be formed of transparent resin aside from a reflective material. When the planarization layer 289 is formed of a transparent resin, a separate black matrix 930 may be formed along the upper surface periphery of the light emitting device 310. The separate black matrix 930 may minimize and/or reduce the amount of light emitted from the side of the light emitting device 310, and may absorb external light. Accordingly, when lowering the height of the reflective layer 281, the black matrix 283 may be located lower than the upper surface of the subpixel 300j, thereby preventing and/or reducing the mixing of light of different colors between adjacent subpixels to improve the contrast ratio of the display.

According to an embodiment, the encapsulation structure 370j of the subpixel 300j may include the first inorganic film 371j, the second inorganic film 373j and the third inorganic film 375j, and this is the same as the aforementioned encapsulation structure 370d (FIG. 14), so the description may not be repeated. The encapsulation structure 370j is somewhat different from the above-mentioned encapsulation structure 370d in that the first inorganic film 371j covers the light emitting surface 311 of the light emitting device and the separate black matrix 930 together.

According to an embodiment, the first inorganic film 371j may cover the entire light emitting surface 311 of the light emitting device 310, the separate black matrix 930 and at least a portion of the side 313 of the light emitting device 310. According to an embodiment, the upper portion of the first inorganic film 371j may be provided with a multi-layered structure in which at least one organic film and at least one inorganic film are alternately stacked.

According to an embodiment, the upper portion of the second inorganic film 373j and the third inorganic film 375j may be provided with a multi-layered structure in which at least one organic film and at least one inorganic film are alternately stacked, respectively.

Figure 20B:
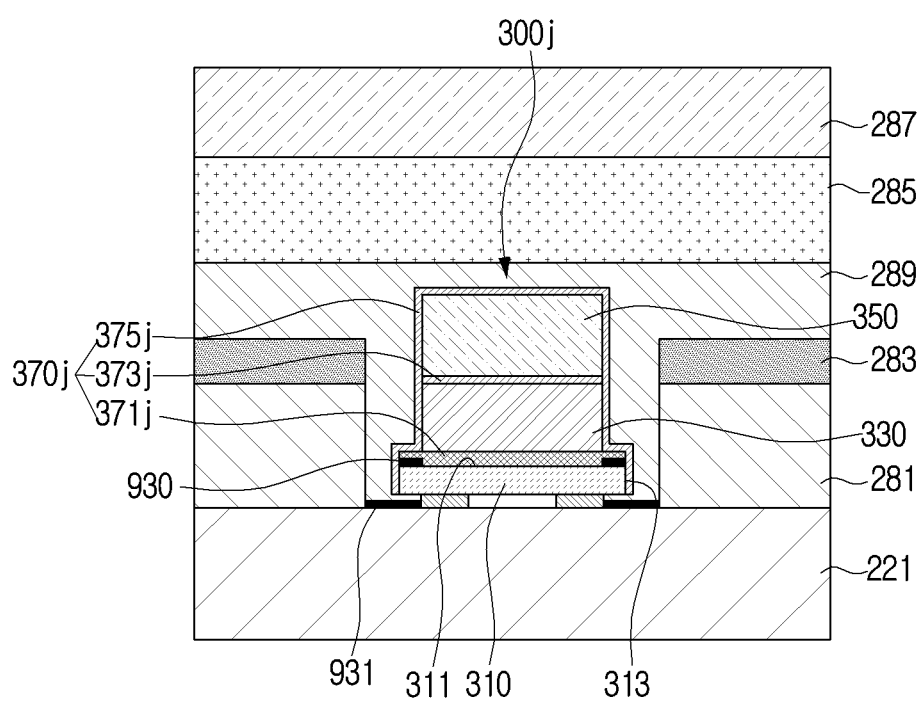

Referring to FIG. 20B, an additional black matrix 931 may be arranged in one portion of the substrate 221. For example, the additional black matrix 931 may be placed on the substrate 221, which is seen between the reflective layer 281 and the side 313 of the light emitting device 310 when looking at the display panel from the front. Accordingly, when looking at the display panel from the front, the black matrix 283, 930, 931 may be visible in addition to the area in which the subpixel 300 is placed. Therefore, the contrast ratio and black visibility of the display panel may be improved.

Figure 21A:
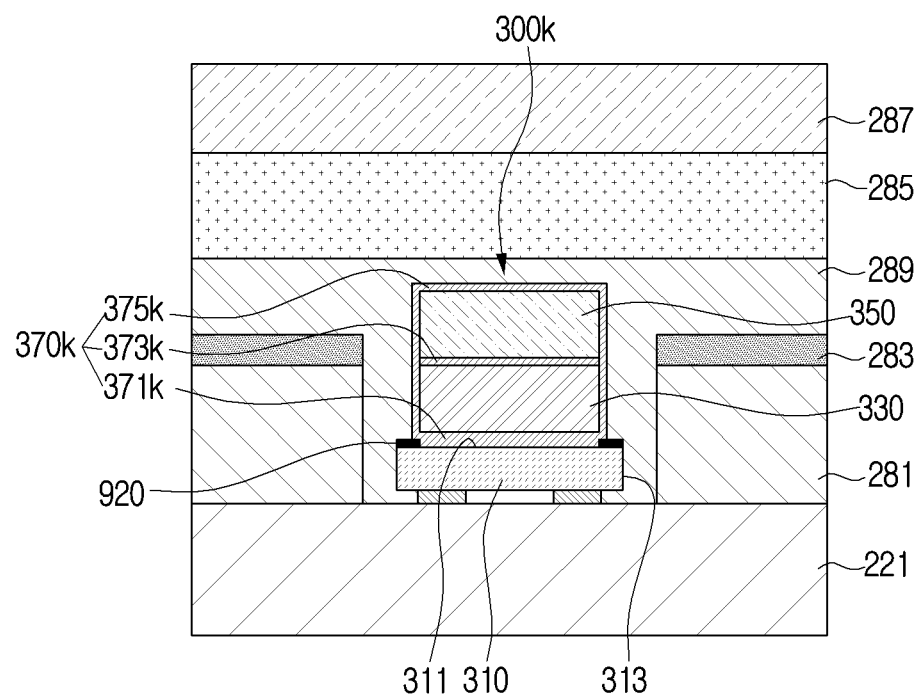

Referring to FIG. 21A, the structure of the display panel is mostly the same as or similar to the aforementioned structure of the display (see FIG. 20A).

According to an embodiment, the encapsulation structure 370k of the subpixel 300k may include a first inorganic film 371k, a second inorganic film 373k, and a third inorganic film 375k, and may be the same as the aforementioned encapsulation structure 370j (FIG. 20A). However, the third inorganic film 375k differs from the above-mentioned encapsulation structure 370*j* in terms of not covering the side 313 of the separate black matrix 930 and the light emitting device 310.

According to an embodiment, the upper portion of the second inorganic film 373*k* and the third inorganic film 375*k* may be provided with a multi-layered structure in which at least one organic film and at least one inorganic film are alternately stacked, respectively.

Figure 21B:
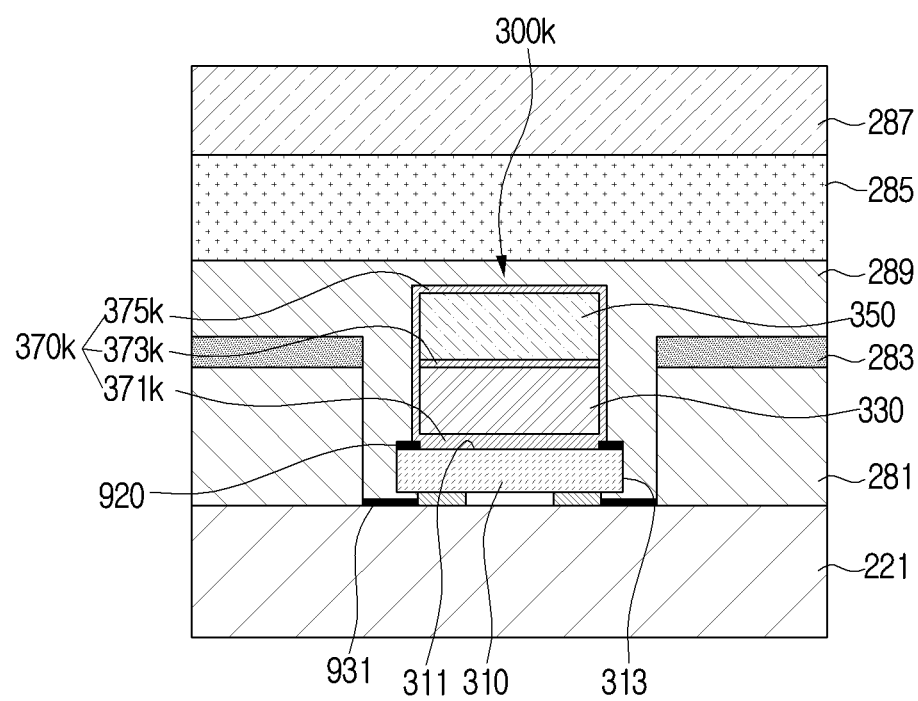

Referring to FIG. 21B, the additional black matrix 931 may also be placed in one portion of the substrate 221. For example, the additional black matrix 931 may be placed on the substrate 221, which is seen between the reflective layer 281 and the side 313 of the light emitting device 310 when looking at the display panel from the front. Accordingly, when looking at the display panel from the front, the black matrix 283, 930, 931 may be visible in addition to the area in which the subpixel 300 is placed. Therefore, the contrast ratio and black visibility of the display panel may be improved.

Figure 22:
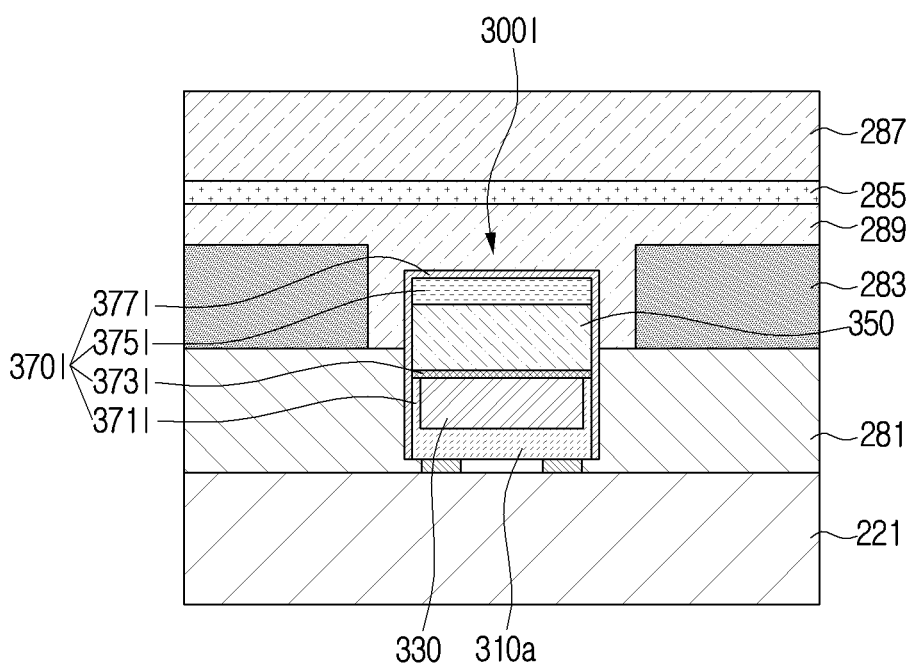

Referring to FIG. 22, the reflective layer 281 according to an embodiment may adhere to the side of a subpixel 300*l*. In this example, the upper portion of the reflective layer 281 may be located up to approximately the medium height of the color filter layer 350. The upper portion of the black matrix 283 placed at the upper portion of the reflector layer 281 may be placed at a position higher than the upper portion of the subpixel 300*l*. Accordingly, the subpixel 300*l* may secure the contrast ratio of the display without having to have a separate black matrix.

According to an embodiment, the subpixel 300*l* may be formed with a partition 371*l* substantially vertically formed to the upper portion of the light emitting device 310*a*. A groove filled with the color conversion layer 330 may be provided at the upper portion of the light emitting device 310*a* by the partition 371*l*.

According to an embodiment, the partition 371*l* may be a part of the encapsulation structure 370*l*. The encapsulation structure 370*l* may include the partition 371*l*, the first inorganic film 373*l*, the organic film 375*l*, and the second inorganic film 377*l*.

According to an embodiment, the first inorganic film 373*l* may be formed to cover the upper end of the partition 371*l* and the upper surface of the color conversion layer 330. Accordingly, the color conversion layer 330 is surrounded by a light emitting device 310*a*, a partition 371*l* and a first inorganic film 373*l*, which may be protected from moisture and oxygen penetration.

According to an embodiment, the first inorganic film 373*l* may be provided with the multi-layered structure in which at least one organic film and at least one inorganic film are alternately stacked.

According to an embodiment, the organic film 375*l* may be formed to cover the upper surface of the color filter layer 350.

According to an embodiment, the second inorganic film 377*l* may be extended from the upper surface of the organic film 375*l* to cover the side surface of the light emitting device 310*a*.

According to an embodiment, the upper portion of the second inorganic film 377*l* may be provided with a multi-layered structure in which at least one organic film and at least one inorganic film are alternately stacked.

When the partition 371*l* is integrally extended to the upper portion of the light emitting device 310*a*, the partition 371*l* may be formed with the light emitting device 310*a* during the process of forming the light emitting device 310*a* in an epi-substrate (not shown). The epi-substrate may be, for example, a sapphire (Al2O3) or silicon (Si) wafer. According to an embodiment, the epitaxy process (or epitaxial growth) may use a method such as metal organic chemical vapor deposition (MOCVD), liquid phase epitaxy (LPE), vapor phase epitaxy (VPE), or molecular beam epitaxy (MBE).

Figure 23:
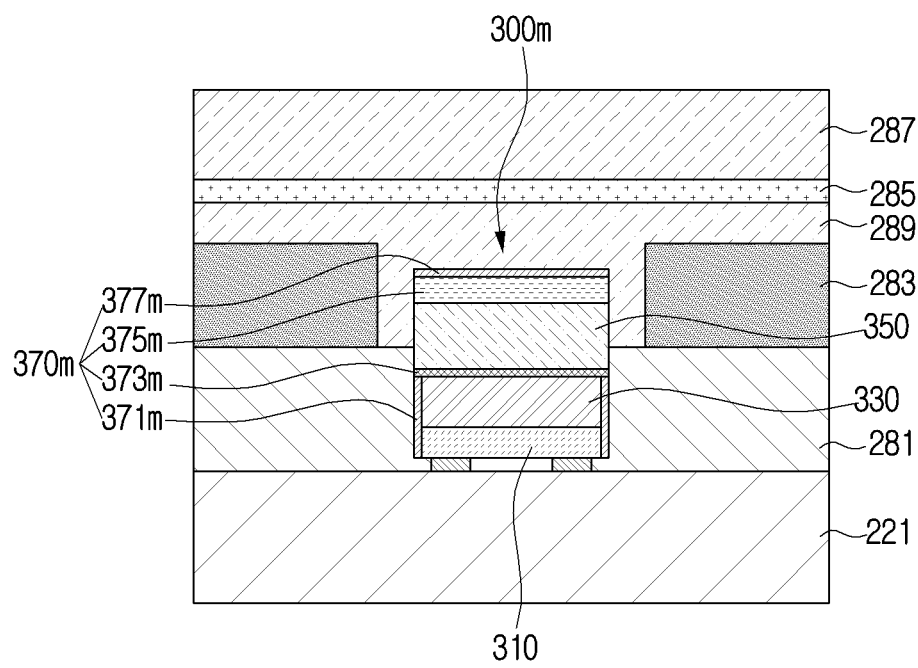

Referring to FIG. 23, the structure of the display panel is mostly the same as or similar to the structure of the above-mentioned display panel (FIG. 22). However, there is a difference in that there is no extended partition (e.g. partition (371*l*) of FIG. 22) extended to the upper portion of the light emitting device 310 and a part of the encapsulation structure 370*m* includes a metal thin film 371*m*.

According to an embodiment, the encapsulation structure 370*m* of the subpixel 100*m* may include the metal thin film 371*m*, the first inorganic film 373*m*, the organic film 375*m*, and the second inorganic film 377*m*.

According to an embodiment, the metal thin film 371*m* may be formed to cover the side surface of the light emitting device 310 and the side surface of the color conversion layer 330 of the light emitting device 310 together through the deposition process.

According to an embodiment, the first inorganic film 373*m* may be formed to cover the upper surface of the color conversion layer 330 and the upper end of the metal thin film 371*m* together. The organic film 375*m* may be formed to cover the upper surface of the color filter layer 350. The second inorganic film 377*m* may be formed to cover the upper surface of the organic film 375*m*.

According to an embodiment, the upper portion of the first inorganic film 373*m* and the second inorganic film (377*m*) may be provided with a multi-layered structure in which at least one organic film and at least one inorganic film are alternately stacked, respectively.

Figure 24:
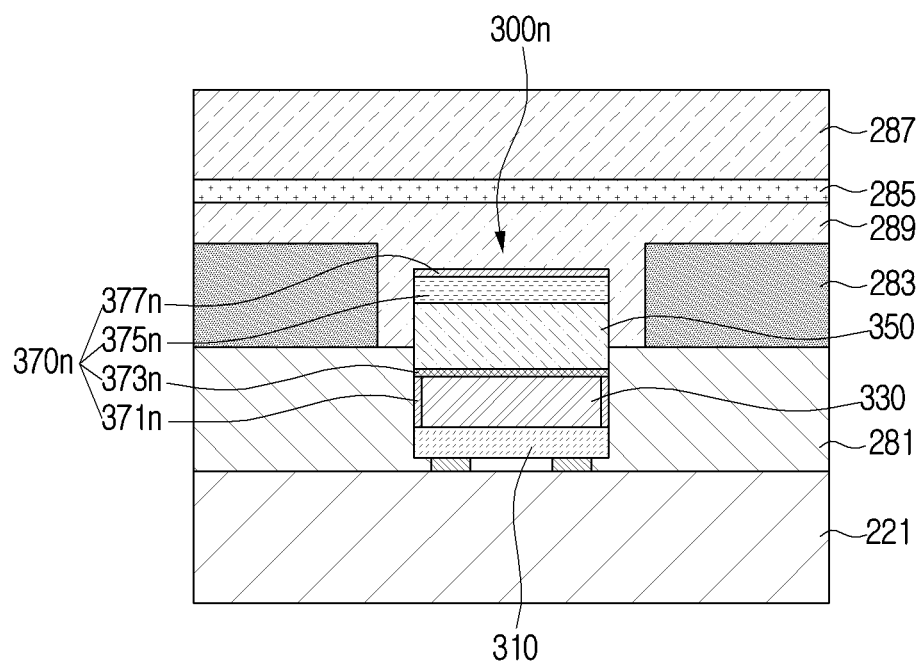

Referring to FIG. 24, the encapsulation structure 370*n* provided in the structure of the display panel and the subpixel 300*n* is mostly the same as or similar to the encapsulation structure (see 370*m*, 23) of the display panel and the encapsulation structure 370*m* (FIG. 23) of the subpixel 300*m*. However, there is a difference from the above-mentioned encapsulation structure 370*m* in that the metal thin film 371*n* forming part of the encapsulation structure 370*n* is formed to cover only the side of the color conversion layer 330.

According to an embodiment, the encapsulation structure 370*n* of the subpixel 300*n* may include the metal thin film 371*n*, the first inorganic film 373*n*, the organic film 375*n*, and the second inorganic film 377*n*.

According to an embodiment, the upper portion of the first inorganic film 373*n* and the second inorganic film 377*n* may be provided with a multi-layered structure in which at least one organic film and at least one inorganic film are alternately stacked, respectively.

In the display module 160 according to an embodiment, the encapsulation structure may be applied to a plurality of light sources, individually. The display module 160 according to an example embodiment may include the display panel 210 and the driving circuit 230. The display panel 160 may include the substrate 221, a plurality of light emitting devices 300, 400, 500 mounted on the substrate, a color conversion layer 330 and a color filter layer 350 stacked on each of the plurality of light emitting devices. The size of the color conversion layer 330 may be less than a size of the corresponding light emitting device 310. The driving circuit 230 may be configured to generate a driving signal of the plurality of light emitting devices.

According to various example embodiments, the encapsulation structure 370 may include the first inorganic film 371 covering an upper surface of the light emitting device and the second inorganic film 373 covering from an upper surface of the color filter layer to a side surface of the light emitting device. The encapsulation structure may further include a third inorganic film 373d covering an upper surface of the color conversion layer.

The display module 160 according to an example embodiment may further include: a reflective layer 281 being spaced from a side surface of the light source and surrounding the light source, the black matrix 283 disposed on an upper surface of the reflective layer and positioned at a height lower than height of the light source, and an additional black matrix 930 formed along a periphery of the upper surface of the light emitting device, and covered by the first inorganic film.

The display module 160 according to an example embodiment may further include the planarization layer 289 covering the black matrix and the light source, the transparent cover 287 covering the planarization layer, and the optical adhesive layer 285 disposed between the planarization layer and the transparent cover.

According to various example embodiments, the encapsulation structure 370a may include the first inorganic film 371a covering an upper surface of the light emitting device, the second inorganic film 373a covering an upper surface of the color filter layer, the organic film 375a covering an upper surface of the second inorganic film, and a fourth inorganic film 377a covering from an upper surface of the organic film to a side surface of the light emitting device. The encapsulation structure may further include the fifth inorganic film 373c, disposed between the color conversion layer and the color filter layer, covering an upper surface of the color conversion layer.

According to various example embodiments, the encapsulation structure 370b may include the first inorganic film 371b covering an upper surface of the light emitting device and the second inorganic film 373b covering from an upper surface of the color conversion layer to a side surface of the light emitting device. In this example, the encapsulation structure may include a third inorganic film 375b covering the upper surface of the color filter layer, an organic film 377b covering an upper surface of the third inorganic film, and a fourth inorganic film 379b covering a side surface of the second inorganic film from the upper surface of the organic film.

According to various example embodiments, the encapsulation structure may further include: a light diffusing agent 285 comprising a light diffusing material including at least one of the color conversion layer, color filter layer, and organic film, thereby improving light efficiency of light sources.

The display module 160 according to an example embodiment may further include the reflective layer 281 surrounding a side surface of the light source in an adhesive state, the black matrix 283 disposed on an upper surface of the reflective layer, the transparent cover 287 disposed on an upper surface of the black matrix, and the optical adhesive layer 285 disposed between the black matrix and the transparent cover. The optical adhesive layer may further include an optical diffusing agent.

According to various embodiments, the encapsulation structure 370h, 370i may be disposed on an upper surface of the light emitting device and is portioned into a plurality of spaces, and the color conversion layer 333, 335 may be filled in each of the plurality of spaces. The plurality of spaces may be disposed with intervals along the light emitting surface of the light emitting device, or may be disposed with intervals in a vertical direction from the light emitting surface of the light emitting device.

According to various embodiments, the encapsulation structure may further include an additional inorganic film 377h, 379i covering a color filter layer.

According to various embodiments, the encapsulation structure 370k may include the first inorganic film 371k covering an upper surface of the light emitting device, the second inorganic film 373k covering an upper surface of the color conversion layer, and the third inorganic film 375k sequentially covering from an upper surface of the color filter layer to a side surface of the color conversion layer. In this example, the reflective layer 281 surrounding the light source in a state of being apart on a side surface of the light source, the black matrix 283 located at a position lower than the height of the light source and positioned on an upper surface of the reflective layer, and the additional black matrix 920 formed along the upper surface periphery of the light emitting device.

The display module 160 according to an embodiment may further include the black matrix 283, the planarization layer 289 covering the light source, the transparent cover 287 covering the planarization layer, and the optical adhesive layer 285 disposed between the planarization layer and the transparent cover.

According to various example embodiments, the encapsulation structure 370l may have a partition extending from the upper surface so that the color conversion layer 330 is filled in the groove provided in an upper surface of the light emitting device. In this case, the partition 371l may be formed by processing an upper portion of the light emitting device and may be integrally formed with the light emitting device. In this example, the encapsulation structure may include the partition 371l, and a first inorganic film 373l covering an upper surface of the partition 371l and an upper surface of the color conversion layer. In this example, the encapsulation structure may further include an organic film 375l covering the upper surface of the color filter layer. The encapsulation structure may further include a second inorganic film 377l covering the side of the light emitting device from the upper surface of the organic film.

According to various example embodiments, the encapsulation structure 370m may include a metal thin film 371m covering a side surface of the color conversion layer and a first inorganic film 373m covering an upper end of the metal thin film and an upper surface of the color conversion layer. In this example, the metal thin film 371m may extend to the side of the light emitting device. The encapsulation structure may further include the organic film 375m covering the upper surface of the color filter layer and the second inorganic film 377m covering the upper surface of the organic film.

An electronic apparatus according to an example embodiment may include the display module 160 and the processor 120. According to various example embodiments, the display module 160 may include the substrate 221, a plurality of light sources 300 including the light emitting device 310 mounted on the substrate, the color conversion layer 330 and the color filter layer 350 stacked on the light emitting device, and the individual encapsulation structure 370, the reflective layer 281 surrounding a side surface of the light source and configured to reflect light emitted from a side surface of the light source, the display panel 210 disposed on the reflective layer in a grating form and including the black matrix 283 surrounding the light source, and the driving circuit 230, disposed on the substrate, and configured to generate a driving signal of the plurality of light emitting devices, the encapsulation structure may include the first inorganic film covering an upper surface, a side surface, and a lower surface of the color conversion layer and the second inorganic film covering the upper surface of the organic film. The size of the color conversion layer 330 may be less than the size of the light emitting device 310.

While the disclosure has been illustrated and described with reference to various example embodiments, it will be understood that the various example embodiments are intended to be illustrative, not limiting. It will also be understood by those skilled in the art, that various modifications can be made, without departing from the true spirit and full scope of the disclosure, including the appended claims and their equivalents. It will also be understood that any of the embodiment(s) described herein may be used in conjunction with any other embodiment(s) described herein.

What is claimed is:

1. A display module comprising:
a display panel comprising a substrate;
a light source mounted on the substrate, the light source comprising:
a light emitting device;
a color conversion layer and a color filter layer stacked on the light emitting device, wherein the color filter layer is arranged above the color conversion layer; and
a thin film encapsulation structure which continuously covers at least a part of a side surface of the color conversion layer and the color filter layer, wherein the encapsulation structure comprises:
a first inorganic film covering an upper surface of the light emitting device; and
a second inorganic film covering from an upper surface of the color filter layer to a side surface of the light emitting device;
a driving circuit configured to generate a driving signal for the light emitting device; and
wherein an area of the color conversion layer overlaps at least a part of the light emitting device.

2. The display module of claim 1, wherein the encapsulation structure further comprises: a third inorganic film covering an upper surface of the color conversion layer.

3. The display module of claim 2, further comprising:
a reflective layer, being spaced on a side surface of the light source, surrounding the light source;
a black matrix disposed on an upper surface of the reflective layer and positioned such that an upper surface of the black matrix is at a height lower than an upper surface of the light source; and
an additional black matrix formed along a periphery of the upper surface of the light emitting device,
wherein the additional black matrix is covered by the first inorganic film.

4. The display module of claim 3, further comprising:
a planarization layer covering the black matrix and the light source;
a transparent cover covering the planarization layer; and
an optical adhesive layer disposed between the planarization layer and the transparent cover.

5. The display module of claim 1, wherein the encapsulation structure comprises:
a first inorganic film covering an upper surface of the light emitting device;
a second inorganic film covering an upper surface of the color filter layer;

an organic film covering an upper surface of the second inorganic film; and
a fourth inorganic film covering from an upper surface of the organic film to a side surface of the light emitting device.

6. The display module of claim 5, wherein the encapsulation structure further comprises: a fifth inorganic film disposed between the color conversion layer and the color filter layer and covering an upper surface of the color conversion layer.

7. The display module of claim 1, wherein the encapsulation structure comprises:
a first inorganic film covering an upper surface of the light emitting device; and
a second inorganic film covering from an upper surface of the color conversion layer to a side surface of the light emitting device.

8. The display module of claim 7, wherein the encapsulation structure further comprises a third inorganic film covering an upper surface of the color filter layer.

9. The display module of claim 8, wherein the encapsulation structure further comprises an organic film covering an upper surface of the third inorganic film.

10. The display module of claim 9, wherein the encapsulation structure further comprises a fourth inorganic film covering from an upper surface of the organic film to a side surface of the second inorganic film.

11. The display module of claim 9, further comprising: a light diffusing material included at least one of the color conversion layer, the color filter layer, and the organic layer.

12. The display module of claim 1, further comprising:
a reflective layer surrounding a side surface of the light source in an adhesive state;
a black matrix disposed on an upper surface of the reflective layer;
a transparent cover disposed on an upper surface of the black matrix; and
an optical adhesive layer disposed between the black matrix and the transparent cover.

13. The display module of claim 1, wherein the encapsulation structure is disposed on an upper surface of the light emitting device and is portioned into a plurality of spaces, and
wherein the color conversion layer is disposed in each of the plurality of spaces.

14. The display module of claim 1, wherein the encapsulation structure comprises:
a first inorganic film covering an upper surface of the light emitting device;
a second inorganic film covering an upper surface of the color conversion layer; and
a third inorganic film covering from an upper surface of the color filter layer to a side surface of the color conversion layer.

15. The display module of claim 1, wherein the light emitting device includes a partition extending from the upper surface to provide a groove in the upper surface of the light emitting device, and
wherein the color conversion layer is disposed in the groove.

16. The display module of claim 1, wherein the encapsulation structure comprises:
a metal thin film covering a side surface of the color conversion layer; and
a first inorganic film covering an upper end of the metal thin film and an upper surface of the color conversion layer.

17. An electronic apparatus comprising:

a display module comprising a display panel and a driving circuit;

a processor, comprising processor circuitry, configured to control the driving circuit to generate a driving signal for controlling light emission of a light emitting device;

wherein the display panel comprises:

a substrate;

a light source including the light emitting device mounted on the substrate;

a color conversion layer and a color filter layer stacked on the light emitting device, wherein the color filter layer is arranged upper the color conversion layer; and, an individual thin film encapsulation structure provided for the light emitting device;

a reflective layer surrounding a side surface of the light source and configured to reflect light emitted from a side surface of the light source;

wherein the display panel is disposed on the reflective layer in a grating form and includes a black matrix surrounding the light source;

wherein the driving circuit is disposed on the substrate, and configured to generate the driving signal of the light emitting device; and wherein the thin film encapsulation structure continuously covers at least a side surface of the color conversion layer and color filter.

18. The electronic apparatus of claim 17, wherein the encapsulation structure further comprises: an organic film covering an upper surface of the color filter layer, and a second inorganic film covering an upper surface of the organic film.

19. The electronic apparatus of claim 17, wherein an area of the color conversion layer overlaps at least a part of the light emitting device.

* * * * *